US012563903B2

(12) United States Patent
Wang et al.

(10) Patent No.: US 12,563,903 B2
(45) Date of Patent: Feb. 24, 2026

(54) DISPLAY DEVICE, DISPLAY PANEL AND METHOD OF MANUFACTURING THE SAME

(71) Applicant: BOE TECHNOLOGY GROUP CO., LTD., Beijing (CN)

(72) Inventors: Yu Wang, Beijing (CN); Kuanta Huang, Beijing (CN); Qing Wang, Beijing (CN); Yongfa Dong, Beijing (CN); Chao Yang, Beijing (CN); Shipeng Li, Beijing (CN); Hui Tong, Beijing (CN); Shangquan Shi, Beijing (CN); Xiong Yuan, Beijing (CN); Dongsheng Li, Beijing (CN); Xiaobin Shen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1156 days.

(21) Appl. No.: 17/511,660

(22) Filed: Oct. 27, 2021

(65) Prior Publication Data

US 2022/0052136 A1 Feb. 17, 2022

Related U.S. Application Data

(63) Continuation of application No. 17/432,416, filed as application No. PCT/CN2021/074943 on Feb. 2, 2021.

(30) Foreign Application Priority Data

Mar. 27, 2020 (CN) .......................... 202010230956.6

(51) Int. Cl.
*H10K 59/122* (2023.01)
*H10K 59/131* (2023.01)
(Continued)

(52) U.S. Cl.
CPC ......... *H10K 59/122* (2023.02); *H10K 59/131* (2023.02); *H10K 59/38* (2023.02);
(Continued)

(58) Field of Classification Search
CPC ........... H10K 59/122; H10K 59/80515; H10K 59/80521; H10K 71/00; H10K 59/123; H10K 59/1315; H10K 2102/351
See application file for complete search history.

(56) References Cited

U.S. PATENT DOCUMENTS 9,236,581 B2 *  1/2016  Kato ...................... H10K 50/15
2014/0197417 A1  7/2014  Nanai et al.
(Continued)

FOREIGN PATENT DOCUMENTS

CN  104218062 A  12/2014
CN  105845711 A  8/2016
(Continued)

OTHER PUBLICATIONS

Organic EL display panel (Year: 2011).*
(Continued)

*Primary Examiner* — Ratisha Mehta
(74) *Attorney, Agent, or Firm* — Perilla Knox & Hildebrandt LLP; Kenneth A. Knox

(57) ABSTRACT

A display panel includes a drive backplane, a first electrode layer, a light-emitting function layer, and a second electrode. The first electrode layer is provided on a surface of the drive backplane and includes a plurality of first electrodes. The first electrode includes a flat middle part and an edge part surrounding the middle part. The edge part includes a horizontal part surrounding the middle part and a climbing part connecting the middle part and the horizontal part. The light-emitting function layer covers the middle part. The second electrode covers the light-emitting function layer and
(Continued)

includes a separating part and a plurality of flat parts separated by the separating part. Orthographic projections are located within the first electrodes. The separating part includes a protruding area and first recessed areas connecting the protruding area and the flat parts. Orthographic projections of the first recessed areas are outside the middle parts.

11 Claims, 12 Drawing Sheets

(51) Int. Cl.
    *H10K 59/38*      (2023.01)
    *H10K 59/80*      (2023.01)
    *H10K 59/12*      (2023.01)

(52) U.S. Cl.
    CPC . *H10K 59/80515* (2023.02); *H10K 59/80521* (2023.02); *H10K 59/1201* (2023.02)

(56)            References Cited

U.S. PATENT DOCUMENTS

| | | |
|---|---|---|
| 2015/0048328 A1 | 2/2015 | Kato et al. |
| 2015/0228927 A1 | 8/2015 | Kim |
| 2017/0194602 A1 | 7/2017 | Cui et al. |
| 2017/0373124 A1 | 12/2017 | Yang et al. |
| 2019/0115560 A1 | 4/2019 | Kim |
| 2019/0280062 A1 | 9/2019 | Ma |
| 2020/0035941 A1 | 1/2020 | Yoo et al. |

FOREIGN PATENT DOCUMENTS

| | | | |
|---|---|---|---|
| CN | 108242458 | A | 7/2018 |
| CN | 108364975 | A | 8/2018 |
| CN | 109950292 | A | 6/2019 |
| CN | 105845711 | B | 5/2020 |
| CN | 212342660 | U | 1/2021 |
| JP | 2005347275 | A | 12/2005 |
| JP | 2006221960 | A | 8/2006 |
| JP | 2007095606 | A | 4/2007 |
| JP | 2008300169 | A | 12/2008 |
| JP | 2009266763 | A | 11/2009 |
| JP | 2011210407 | A | 10/2011 |
| JP | 2011249089 | A * | 12/2011 |
| JP | 2012048906 | A | 3/2012 |
| JP | 2012190682 | A | 10/2012 |
| JP | 2019102337 | A | 6/2019 |
| KR | 20180011982 | A | 2/2018 |

OTHER PUBLICATIONS

First Office Action for JP Patent Application No. 2021-571439 of Jul. 29, 2024.
Extended European Search Report for EP Patent Application No. 21775976.0 of Mar. 4, 2024.
International Search Report and Written Opinion for International Application No. PCT/CN2021/074943 mailed May 8, 2021.
Second Office Action for Australia Patent Application No. 2021244430 of Feb. 16, 2024.
Notice of Allowance for Russian Federation Patent Application No. 2022127034 of Jan. 9, 2024.
3rd Office Action for CN Patent Application No. 2021800029633 of Aug. 9, 2023.

\* cited by examiner

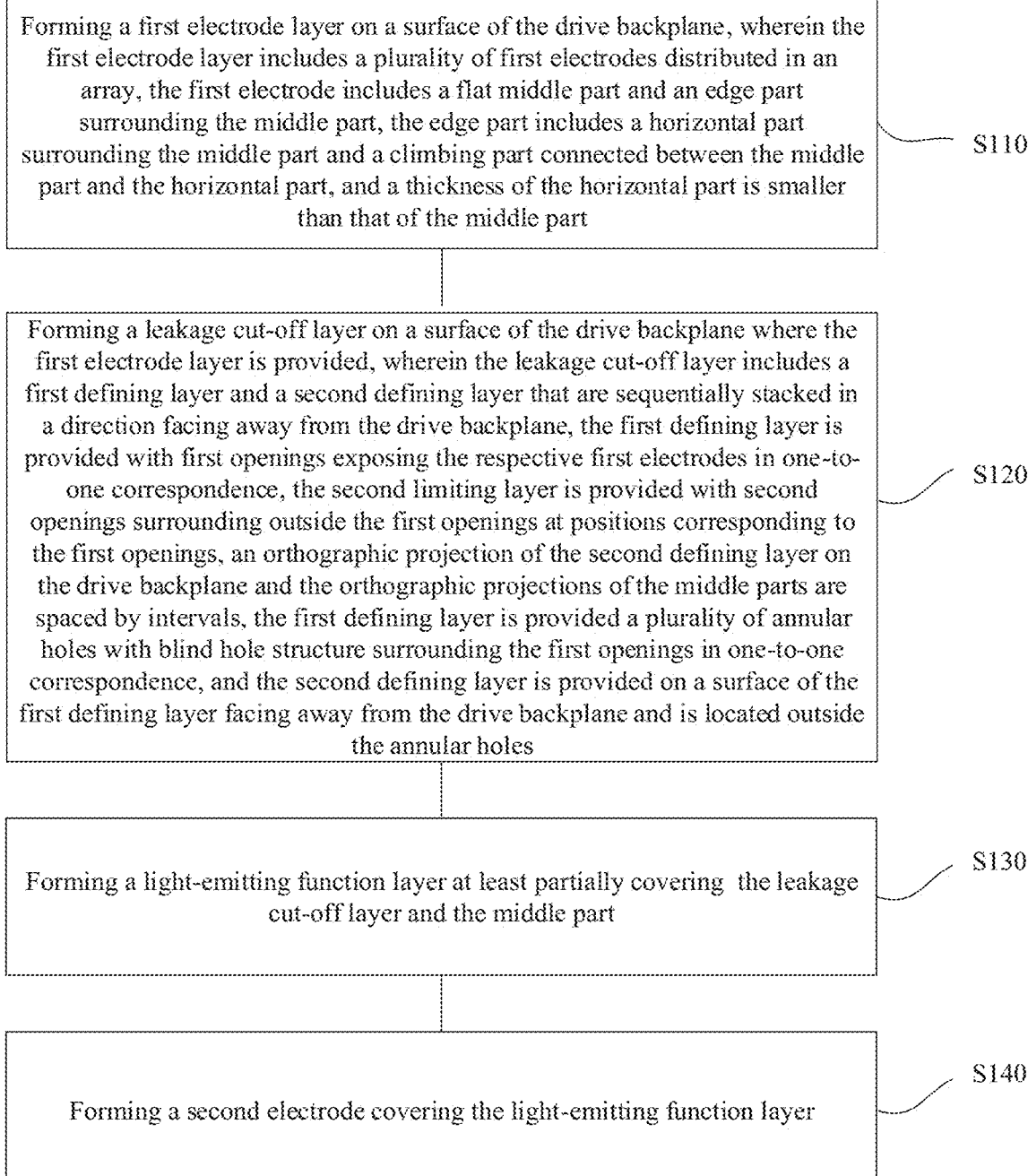

Forming a first electrode layer on a surface of the drive backplane, wherein the first electrode layer includes a plurality of first electrodes distributed in an array, the first electrode includes a flat middle part and an edge part surrounding the middle part, the edge part includes a horizontal part surrounding the middle part and a climbing part connected between the middle part and the horizontal part, and a thickness of the horizontal part is smaller than that of the middle part — S110

Forming a leakage cut-off layer on a surface of the drive backplane where the first electrode layer is provided, wherein the leakage cut-off layer includes a first defining layer and a second defining layer that are sequentially stacked in a direction facing away from the drive backplane, the first defining layer is provided with first openings exposing the respective first electrodes in one-to-one correspondence, the second limiting layer is provided with second openings surrounding outside the first openings at positions corresponding to the first openings, an orthographic projection of the second defining layer on the drive backplane and the orthographic projections of the middle parts are spaced by intervals, the first defining layer is provided a plurality of annular holes with blind hole structure surrounding the first openings in one-to-one correspondence, and the second defining layer is provided on a surface of the first defining layer facing away from the drive backplane and is located outside the annular holes — S120

Forming a light-emitting function layer at least partially covering the leakage cut-off layer and the middle part — S130

Forming a second electrode covering the light-emitting function layer — S140

FIG. 11

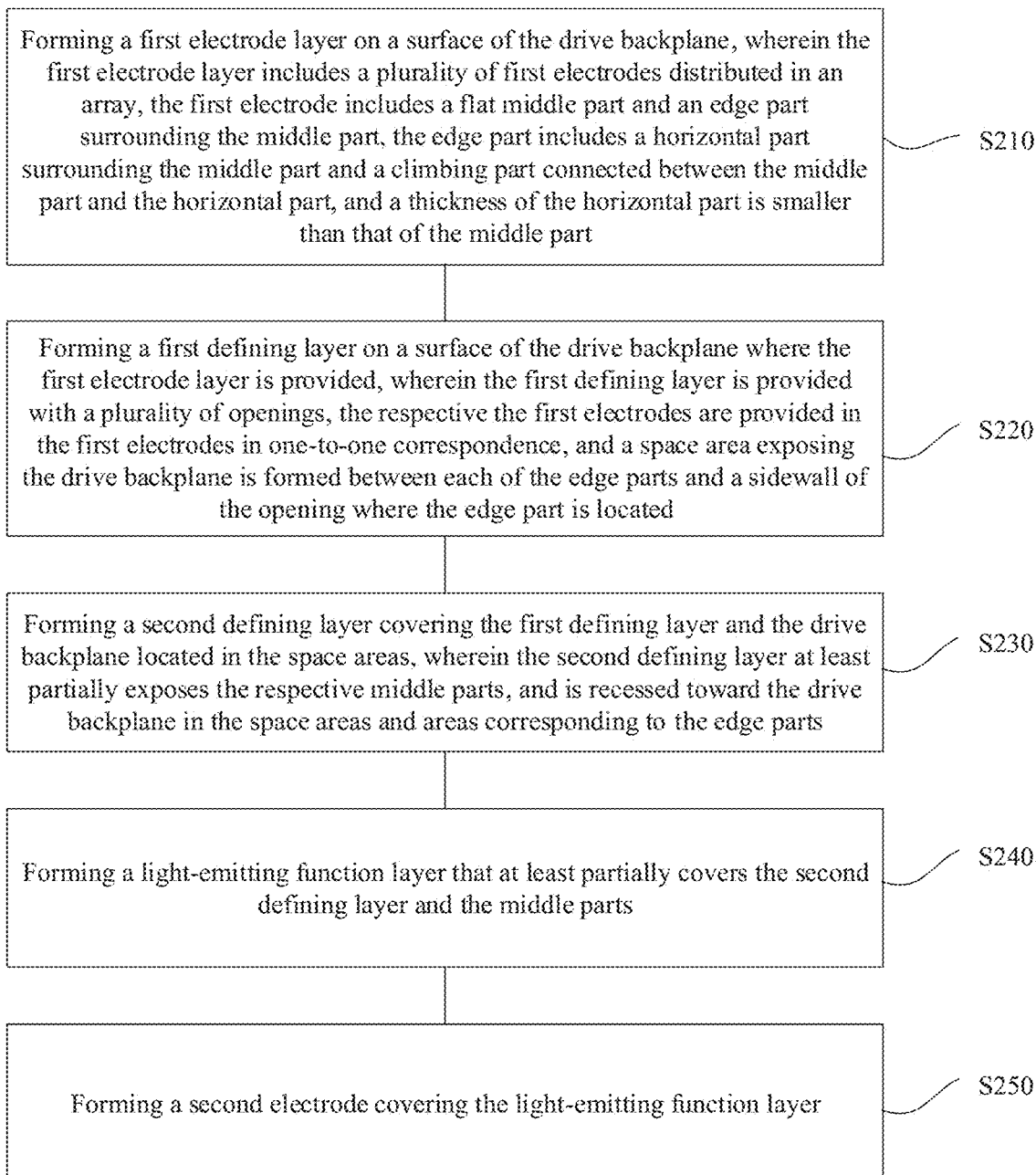

Forming a first electrode layer on a surface of the drive backplane, wherein the first electrode layer includes a plurality of first electrodes distributed in an array, the first electrode includes a flat middle part and an edge part surrounding the middle part, the edge part includes a horizontal part surrounding the middle part and a climbing part connected between the middle part and the horizontal part, and a thickness of the horizontal part is smaller than that of the middle part          S210

Forming a first defining layer on a surface of the drive backplane where the first electrode layer is provided, wherein the first defining layer is provided with a plurality of openings, the respective the first electrodes are provided in the first electrodes in one-to-one correspondence, and a space area exposing the drive backplane is formed between each of the edge parts and a sidewall of the opening where the edge part is located          S220

Forming a second defining layer covering the first defining layer and the drive backplane located in the space areas, wherein the second defining layer at least partially exposes the respective middle parts, and is recessed toward the drive backplane in the space areas and areas corresponding to the edge parts          S230

Forming a light-emitting function layer that at least partially covers the second defining layer and the middle parts          S240

Forming a second electrode covering the light-emitting function layer          S250

FIG. 12

DISPLAY DEVICE, DISPLAY PANEL AND METHOD OF MANUFACTURING THE SAME

CROSS-REFERENCE TO RELATED APPLICATIONS

The present application is a continuation of U.S. patent application Ser. No. 17/432,416 filed Aug. 19, 2021, which is a national phase application under 35 U.S.C. § 371 application of International Application No. PCT/CN2021/074943 filed on Feb. 2, 2021, which claims the benefit of and priority to Chinese Patent Application No. 202010230956.6 entitled "DISPLAY DEVICE, DISPLAY PANEL AND METHOD OF MANUFACTURING THE SAME" filed on Mar. 27, 2020, the contents of all of which being incorporated by reference in their entireties herein.

TECHNICAL FIELD

The present disclosure relates to the field of display technology and, in particular, to a display device, a display panel, and a method of manufacturing the display panel.

BACKGROUND

Currently, OLED (Organic Light-Emitting Diode) display panels are more and more widely used. In an OLED display panel, the light-emitting devices usually include a plurality of OLED light-emitting devices distributed in an array, and each light-emitting device can emit light separately in order to display an image. However, due to the manufacturing process, the luminescence stability of the OLED light-emitting device still needs to be improved.

It should be noted that the information disclosed in the background art section above is only used to enhance the understanding of the background of the present disclosure, and therefore may include information that does not constitute prior art known to those of ordinary skill in the art.

SUMMARY

The purpose of the present disclosure is to provide a display device, a display panel, and a method of manufacturing the display panel.

According to an aspect of the present disclosure, there is provided a display panel, including:

a drive backplane;

a first electrode layer, arranged on a surface of the drive backplane, and including a plurality of first electrodes distributed in an array, wherein the first electrode includes a flat middle part and an edge part surrounding the middle part, the edge part includes a horizontal part surrounding the middle part and a climbing part connected between the middle part and the horizontal part, and a thickness of the horizontal part is smaller than that of the middle part;

a light-emitting function layer, at least partially covering the middle part; and a second electrode, covering the light-emitting function layer, and including a separating part and a plurality of flat parts separated by the separating part, wherein orthographic projections of the respective flat parts on the drive backplane are located within orthographic projections of the first electrodes in one-to-one correspondence, the separating part includes a protruding area and first recessed areas connecting the protruding area and the flat parts, the first recessed areas are recessed toward a side of the flat parts close to the drive backplane, the protruding area protrudes toward a side of the flat parts facing away from the drive backplane, and orthographic projections of the first recessed areas on the drive backplane are at least partially located outside orthographic projections of the middle parts of the first electrodes.

In an exemplary embodiment of the present disclosure, on cross-sections perpendicular to the drive backplane, orthographic projections of lowest points of the first recessed areas on the drive backplane are located outside orthographic projections of the middle parts of the first electrodes.

In an exemplary embodiment of the present disclosure, the first recessed area includes a first side surface connected to the flat part and a second side surface connected to the protruding area, and the first side surface and the second side surface shrink along a direction close to the drive backplane.

In an exemplary embodiment of the present disclosure, a slope of the first side surface relative to the middle part is less than or equal to that of the second side surface relative to the middle part.

In an exemplary embodiment of the present disclosure, a minimum thickness of an area of the second electrode corresponding to the first side surface is greater than that of an area corresponding to the second side surface.

In an exemplary embodiment of the present disclosure, the slope of the first side surface relative to the middle part is less than 60°, and the slope of the second side surface relative to the middle part is not less than 60° and not more than 90°.

In an exemplary embodiment of the present disclosure, a width of the orthographic projection of the first recessed area on the drive backplane is not greater than 0.2 μm.

In an exemplary embodiment of the present disclosure, a depth of the first recessed area is less than twice a maximum thickness of the second electrode.

In an exemplary embodiment of the present disclosure, the maximum thickness of the second electrode is 90 nm, and the depth of the first recessed area is less than 120 nm

.

In an exemplary embodiment of the present disclosure, a slope of the climbing part relative to the drive backplane is not less than 30°.

In an exemplary embodiment of the present disclosure, a minimum value of a distance between a bottom of the first recessed area and the middle part of an adjacent one of the first electrodes in a direction perpendicular to the drive backplane is not less than 70% of a total thickness of the flat part and the light-emitting function layer.

In an exemplary embodiment of the present disclosure, the protruding area has a second recessed area recessed toward the drive backplane, and a depth of the second recessed area is smaller than that of the first recessed area.

In an exemplary embodiment of the present disclosure, the display panel further includes:

a leakage cut-off layer, provided on a same surface of the drive backplane with the first electrode layer, wherein the light-emitting function layer covers the leakage cut-off layer, wherein the leakage cut-off layer includes a first defining layer and a second defining layer sequentially stacked in a direction facing away from the drive backplane, and both the first defining layer and the second defining layer at least partially expose the middle parts of the first electrodes, and an edge of an orthographic projection of the second defining layer on the drive backplane is located outside orthographic projections of the middle part, and on a cross-section perpendicular to the drive backplane, the orthographic projection of the lowest point of the first recessed area on the drive backplane is located between orthographic projections of the middle part and the second defining layer on the drive backplane, and the orthographic projections of the second defining layer on the leakage cut-off layer is located within an orthographic projection of the protruding area on the leakage cut-off layer.

In an exemplary embodiment of the present disclosure, the display panel further includes:

a leakage cut-off layer, including a first defining layer and a second defining layer, wherein the first defining layer and the first electrode layer are provided on a same surface of the drive backplane and have a plurality of openings, the respective first electrodes are arranged in the openings in one-to-one correspondence, and a space area exposing the drive backplane is formed between the edge part of each of the first electrodes and a sidewall of the opening where the first electrode is located, wherein the second defining layer covers the first defining layer and the drive backplane located in the space area, and at least partially exposes the middle part of the first electrode, the second defining layer is recessed toward the drive backplane in the space area and an area corresponding to the edge part, and a thickness of the second defining layer is smaller than that of the first defining layer, and the light-emitting function layer covers the second defining layer.

According to an aspect of the present disclosure, there is provided a display panel, including:

a drive backplane;

a first electrode layer, arranged on a surface of the drive backplane, and including a plurality of first electrodes distributed in an array, wherein the first electrode includes a flat middle part and an edge part surrounding the middle part, the edge part includes a horizontal part surrounding the middle part and a climbing part connected between the middle part and the horizontal part, and a thickness of the horizontal part is smaller than that of the middle part;

a leakage cut-off layer, provided on a same surface of the drive backplane with the first electrode layer, and including a first defining layer and a second defining layer stacked in a direction facing away from the drive backplane, wherein the first defining layer is provided with first openings exposing the respective first electrodes in one-to-one correspondence, the second defining layer is provided with second openings surrounding outside the first openings at positions corresponding to the first openings, an orthographic projection of the second defining layer on the drive backplane and orthographic projections of the middle parts are spaced by intervals, the first defining layer is provided a plurality of annular holes with blind hole structure surrounding the first openings in one-to-one correspondence, and the second defining layer is provided on a surface of the first defining layer facing away from the drive backplane and is located outside the annular holes;

a light-emitting function layer, at least partially covering the leakage cut-off layer and the middle part of the first electrode; and a second electrode, covering the light-emitting function layer.

In an exemplary embodiment of the present disclosure, a distance between a sidewall of the second opening and an edge of the middle part of the first electrode that the second opening surrounds, is not less than ⅕ of a maximum distance between the middle parts of two adjacent ones of the first electrodes.

In an exemplary embodiment of the present disclosure, the distance between the sidewall of the second opening and the edge of the middle part of the first electrode that the second opening surrounds is not less than 0.2 μm.

In an exemplary embodiment of the present disclosure, in a direction perpendicular to the drive backplane, a distance between a surface of the second defining layer facing away from the drive backplane and a surface of the middle part facing away from the drive backplane is not less than 25% of a thickness of the light-emitting function layer, and not more than 80% of the thickness of the light-emitting function layer.

In an exemplary embodiment of the present disclosure, a sidewall of the second opening expands in the direction facing away from the drive backplane, and an angle between the sidewall of the second opening and the middle part is not less than 65°, and not more than 90°.

In an exemplary embodiment of the present disclosure, a groove is provided in an area of the second defining layer outside the second opening.

In an exemplary embodiment of the present disclosure, a width of the groove is smaller than a distance between the middle parts of two adjacent ones of the first electrodes.

In an exemplary embodiment of the present disclosure, the width of the groove is greater than 0.2 μm.

According to an aspect of the present disclosure, there is provided a display panel, including:

a drive backplane;

a first electrode layer, arranged on a surface of the drive backplane, and including a plurality of first electrodes distributed in an array, wherein the first electrode includes a flat middle part and an edge part surrounding the middle part, the edge part includes a horizontal part surrounding the middle part and a climbing part connected between the middle part and the horizontal part, and a thickness of the horizontal part is smaller than that of the middle part;

a leakage cut-off layer, including a first defining layer and a second defining layer, wherein the first defining layer and the first electrode layer are provided on a same surface of the drive backplane, and have a plurality of openings, the respective first electrodes are arranged in the openings in one-to-one correspondence, a space area exposing the drive backplane is formed between the edge part of each of the first electrodes and a sidewall of the opening where the first electrode is located, the second defining layer covers the first defining layer and the drive backplane located in the space area, and at least partially exposes the middle part of the first electrode, the second defining layer is recessed toward the drive backplane in the space area and an area corresponding to the edge part;

a light-emitting function layer, at least partially covering the second defining layer and the middle part of the first electrode; and a second electrode, covering the light-emitting function layer.

In an exemplary embodiment of the present disclosure, a thickness of the second defining layer is smaller than that of the first defining layer.

In an exemplary embodiment of the present disclosure, the drive backplane is provided with an annular groove surrounding the first electrode in the space area, and a part of the second defining layer located in the space area is recessed into the annular groove.

In an exemplary embodiment of the present disclosure, the drive backplane includes:

a substrate;

drive transistors, arranged on a side of the substrate; and a planarization layer provided on a side of the drive transistors facing away from the substrate, wherein the first electrode layer and the leakage cut-off layer are provided on a surface of the planarization layer facing away from the substrate, and the planarization layer and material of the first defining layer and the second defining layer are the same.

In an exemplary embodiment of the present disclosure, orthographic projections of the annular groove and the space area on the drive backplane are overlapped.

In an exemplary embodiment of the present disclosure, a slope of an area of the second electrode corresponding to the sidewall of the opening relative to the middle part is not less than 65° and not more than 90°, and a slope of an area of the second electrode corresponding to the edge part relative to the middle part is less than 60°.

In an exemplary embodiment of the present disclosure, a thickness of the second defining layer is less than ⅕ of a thickness of the first defining layer.

According to an aspect of the present disclosure, there is provided a method of manufacturing a display panel, including:

forming a first electrode layer on a surface of a drive backplane, wherein the first electrode layer includes a plurality of first electrodes distributed in an array, the first electrode includes a flat middle part and an edge part surrounding the middle part, the edge part includes a horizontal part surrounding the middle part and a climbing part connected between the middle part and the horizontal part, and a thickness of the horizontal part is smaller than that of the middle part;

forming a leakage cut-off layer on a surface of the drive backplane where the first electrode layer is provided, wherein the leakage cut-off layer includes a first defining layer and a second defining layer that are sequentially stacked in a direction facing away from the drive backplane, the first defining layer is provided with first openings exposing the respective first electrodes in one-to-one correspondence, the second defining layer is provided with second openings surrounding outside the first openings at positions corresponding to the first openings, an orthographic projection of the second defining layer on the drive backplane and orthographic projections of the middle parts are spaced by intervals, the first defining layer is provided a plurality of annular holes with blind hole structure surrounding the first openings in one-to-one correspondence, and the second defining layer is provided on a surface of the first defining layer facing away from the drive backplane and is located outside the annular holes;

forming a light-emitting function layer at least partially covering the leakage cut-off layer and the middle part; and forming a second electrode covering the light-emitting function layer.

In an exemplary embodiment of the present disclosure, the first defining layer and the second defining layer are formed by a same patterning process.

According to an aspect of the present disclosure, there is provided a method of manufacturing a display panel, including:

forming a first electrode layer on a surface of a drive backplane, wherein the first electrode layer includes a plurality of first electrodes distributed in an array, the first electrode includes a flat middle part and an edge part surrounding the middle part, the edge part includes a horizontal part surrounding the middle part and a climbing part connected between the middle part and the horizontal part, and a thickness of the horizontal part is smaller than that of the middle part;

forming a first defining layer on a surface of the drive backplane where the first electrode layer is provided, wherein the first defining layer is provided with a plurality of openings, the respective the first electrodes are provided in the first electrodes in one-to-one correspondence, and a space area exposing the drive backplane is formed between each of the edge parts and a sidewall of the opening where the edge part is located;

forming a second defining layer covering the first defining layer and the drive backplane located in the space areas, wherein the second defining layer at least partially exposes the respective middle parts, and is recessed toward the drive backplane in the space areas and areas corresponding to the edge parts;

forming a light-emitting function layer that at least partially covers the second defining layer and the middle parts; and forming a second electrode covering the light-emitting function layer.

According to an aspect of the present disclosure, there is provided a display device, including the display panel according to any one of the above.

It should be understood that the above general description and the following detailed description are only exemplary and explanatory, and cannot limit the present disclosure.

BRIEF DESCRIPTION OF THE DRAWINGS

The drawings herein are incorporated into the specification and constitute a part of the specification, show embodiments in accordance with the disclosure, and together with the specification are used to explain the principle of the disclosure. Understandably, the drawings in the following description are only some embodiments of the present disclosure. For those of ordinary skill in the art, other drawings can be obtained based on these drawings without creative work.

FIG. 11 is a schematic diagram of an embodiment of a method of manufacturing a display panel of the present disclosure.

FIG. 12 is a schematic diagram of an embodiment of a method of manufacturing a display panel of the present disclosure.

DETAILED DESCRIPTION

Figure 1:
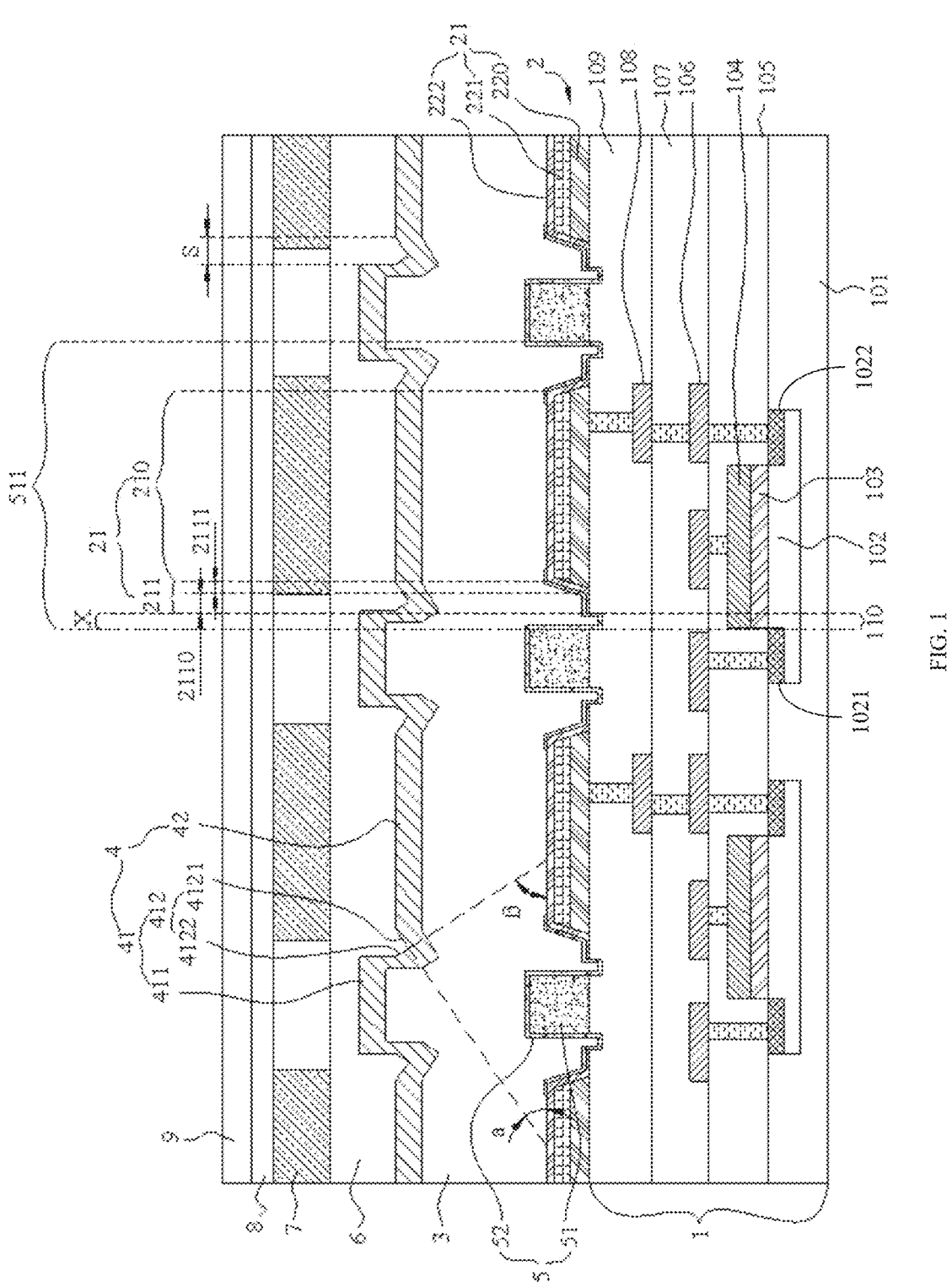
FIG. 1 is a schematic diagram of an embodiment of the first display panel of the present disclosure.

Example embodiments will now be described more fully with reference to the accompanying drawings. However, the example embodiments can be implemented in various forms, and should not be construed as being limited to the embodiments set forth herein; rather, these embodiments are provided such that the present disclosure will be comprehensive and complete, and fully convey the concept of the example embodiments to those skilled in the art. The same reference signs in the figures indicate the same or similar structures, and thus their detailed descriptions will be omitted. In addition, the drawings are only schematic illustrations of the present disclosure, and are not necessarily drawn to scale.

Although relative terms such as "upper" and "lower" are used in this specification to describe the relative relationship between one component and another component in the drawings, these terms are used in this specification only for convenience, for example, the direction of the example described as shown in the drawings. It can be understood that if the device in the drawings is turned upside down, the components described as "upper" will become the "lower" components. When a certain structure is "on" another structure, it may mean that the structure is integrally formed on other structures, or that the structure is "directly" installed on other structures, or that the certain structure is "indirectly" installed on other structures through another structure.

The terms "one", "a", "the", and "said" are used to indicate the presence of one or more elements/components/etc.; the terms "include" and "have" are used to indicate open-ended inclusion means and means that there may be other elements/components/etc. besides the listed elements/components/etc.; the terms "first" and "second" are only used as marks, and are not to limit the number of objects.

In the related art, the OLED display panel includes a drive backplane, a plurality of first electrodes, a pixel defining layer, a light-emitting function layer, a second electrode and a color film layer. The first electrodes are distributed on the drive backplane in an array, the pixel defining layer is set on a surface of the drive backplane where the first electrodes are provided, and each first electrode is exposed. The light-emitting function layer covers the pixel defining layer and surfaces of the first electrodes facing away from the drive backplane, and the second electrode covers a surface of the light-emitting function layer facing away from the drive backplane, such that a plurality of light-emitting devices can be defined by the pixel defining layer. Driven by a driving signal, holes injected by the first electrode and electrons injected by the second electrode enter the light-emitting function layer and form excitons, and the excitons radiate transition emission photons to form electroluminescence. The color filter layer is arranged on a side of the second electrode facing away from the drive backplane, and has a plurality of filter areas in one-to-one correspondence with the light-emitting devices, and each filter area and its corresponding light-emitting device can be used as a sub-pixel.

Since the thickness of the pixel defining layer is greater than that of the first electrode, when the light-emitting function layer is formed by an evaporation process, the light-emitting function layer will be recessed at a junction of the first electrode and the pixel defining layer, that is, at an edge of the light-emitting device, such that the second electrode correspondingly forms a recessed area. The distance between the recessed area of the second electrode and the first electrode is relatively close, which is prone to tip discharge or even short circuit, which affects the stability of the light-emitting device and thus makes it difficult for the display panel to emit light stably. At the same time, the recessed area of the second electrode faces the first electrode, therefore there is also emission of light. However, because shape of the recessed area is a recessed structure toward the drive backplane, rather than a planar structure, the light emitted within the recessed area is in a scattered state, and at least a portion of the light is skewed toward adjacent sub-pixels, such that the light emission of adjacent sub-pixels interferes with each other and affects the display effect.

The light-emitting function layer is recessed at the junction of the first electrode and the pixel defining layer, such that the second electrode forms a recessed area in the area corresponding to the recessing. The recessed area faces the first electrode, that is, an orthographic projection of the recessed area on the drive backplane is within an orthographic projection of the first electrode, such that a tip discharge or even short circuit may occur therebetween. At the same time, the recessed area may emit light, and because the shape of the recessed area is curved, the light emitted by the recessed area is in a scattered state, which may interfere with the light emission of adjacent sub-pixels.

In addition, since the light-emitting function layer is a continuous film layer, such that the sub-pixels are connected to each other, at least a portion of film layers (including but not limited to the hole injection layer) in the light-emitting function layer will cause crosstalk between adjacent sub-pixels. In particular, for a tandem OLED display panel, the light-emitting function layer includes a plurality of light-emitting unit layers, and two adjacent light-emitting unit layers are connected in series through a charge generation layer. However, the charge generation layer has good charge conduction characteristics, which will cause crosstalk between adjacent sub-pixels and affect the light-emitting effect.

In order to solve at least one technical problem in the above-mentioned related art, the embodiments of the present disclosure provide three kinds of display panels.

DESCRIPTION OF REFERENCE SIGNS

Figure 2:
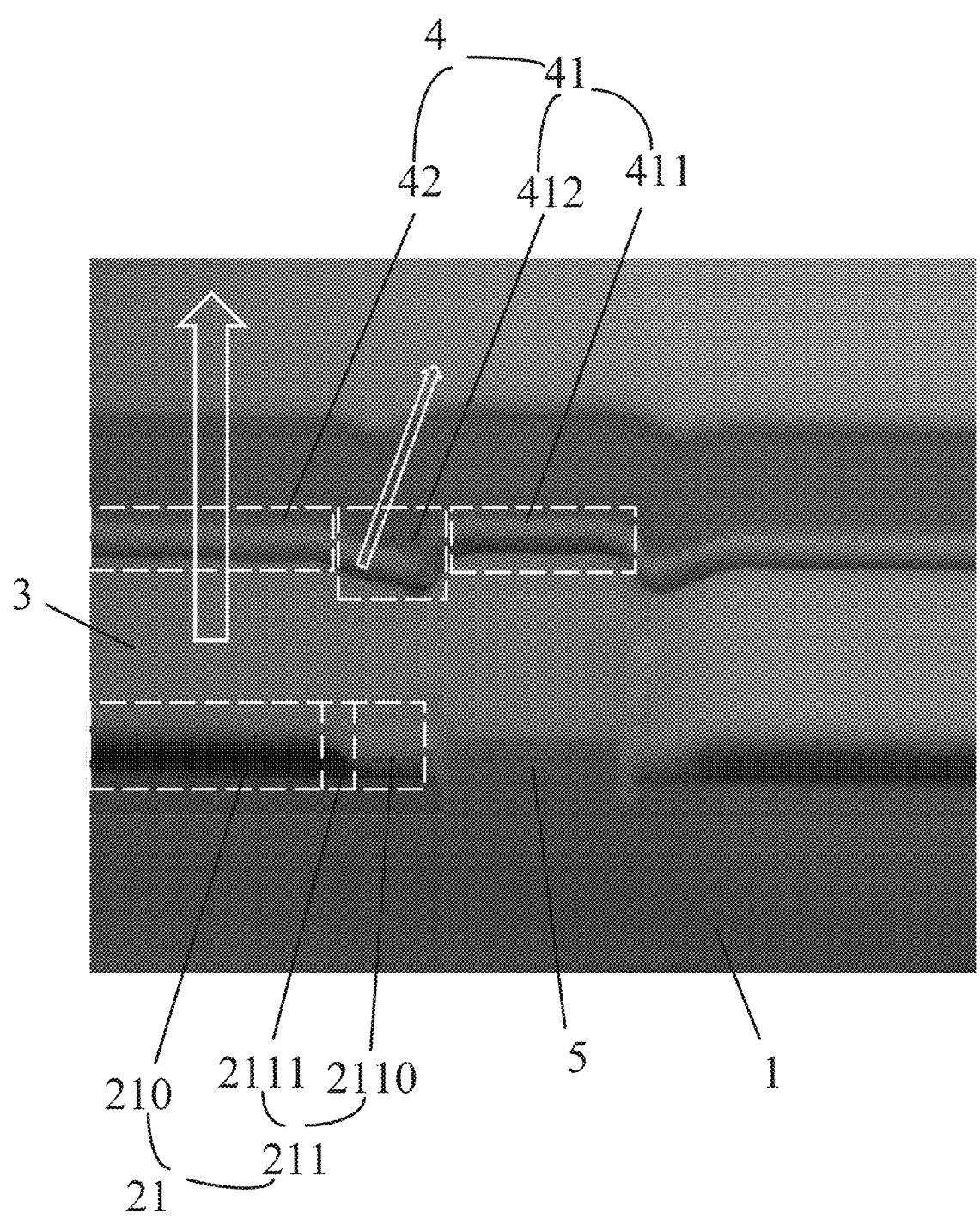
FIG. 2 is an electron micrograph of an embodiment of the first display panel of the present disclosure.
Figure 3:
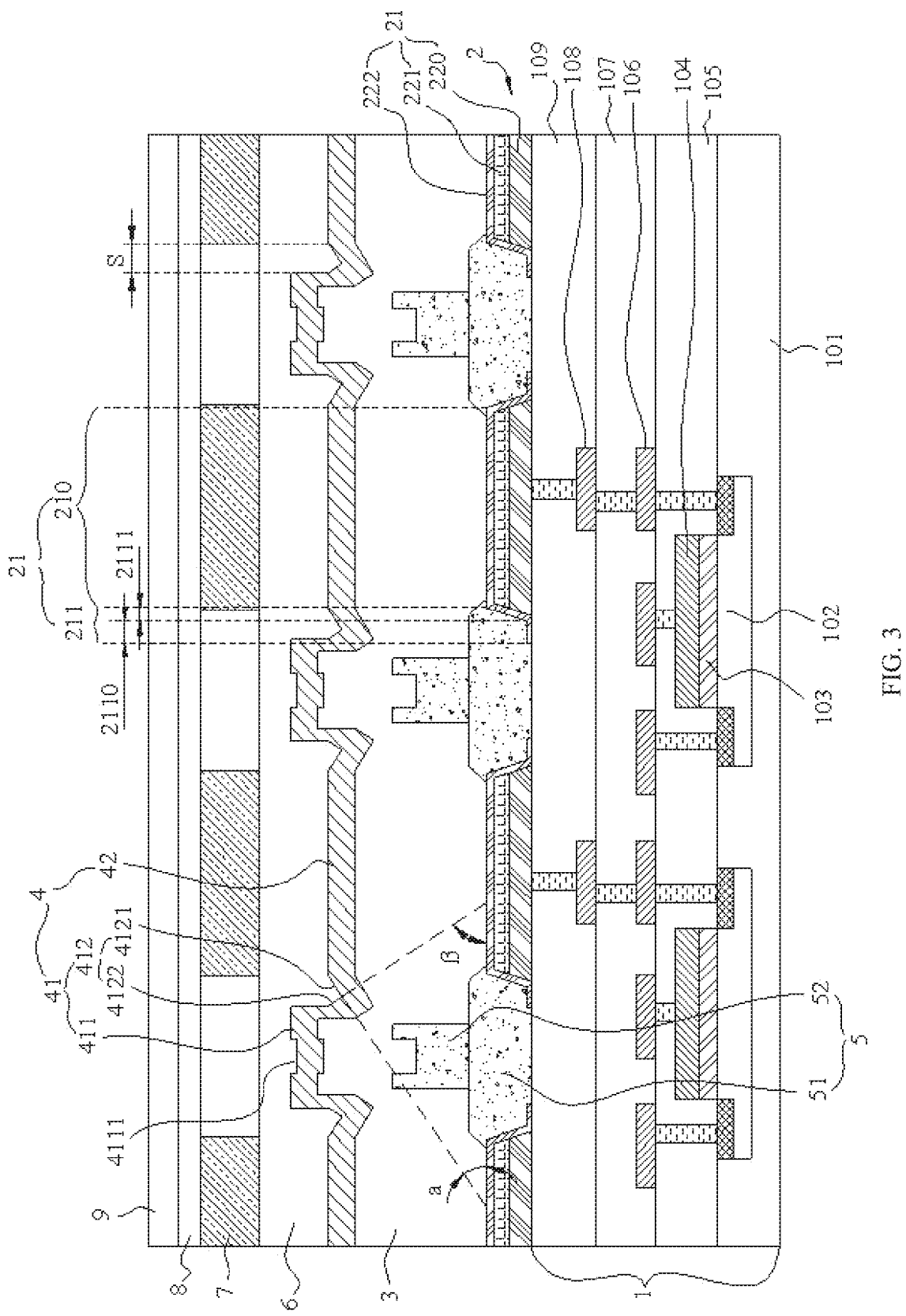
FIG. 3 is a schematic diagram of another embodiment of the first display panel of the present disclosure.

In FIG. 1 to FIG. 3:

1. drive backplane; 101. substrate; 102. active area; 1021. source; 1022. drain; 103. gate insulating layer; 104. gate; 105. first insulating layer; 106. first wiring layer; 107. second insulating layer; 108. second wiring layer; 109. planarization layer; 2. first electrode layer; 21. first electrode; 210. middle part; 211. edge part; 2110. horizontal part; 2111. climbing part; 220. first conductive layer; 221. second conductive layer; 222. third conductive layer; 3. light-emitting function layer; 4. second electrode; 41. separating part; 42. flat part; 411. protruding area; 412. first recessed area; 4121. first side surface; 4122. second side surface; 5. leakage cut-off layer; 51. first defining layer; 511. opening; 52. second defining layer; 6. first encapsulation layer; 7. color film layer; 8. second encapsulation layer; 9. transparent cover plate.

In FIGS. 4-8:

100. drive backplane; 101. substrate; 102. active area; 1021. source; 1022. drain; 103. gate insulating layer; 104. gate; 105. first insulating layer; 106. first wiring layer; 107. second insulating layer; 108. second wiring layer; 109. planarization layer; 200. first electrode layer; 201. first electrode; 210. middle part; 211. edge part; 2110. horizontal part; 2111. climbing part; 220. first conductive layer; 221. second conductive layer; 222. third conductive layer; 300. leakage cut-off layer; 301. first defining layer; 3011. first opening; 3012. annular hole; 302. second defining layer; 3021. second opening; 3022. groove; 400. light-emitting function layer; 401. light-emitting unit layer; 402. charge generation layer; 4111. second recessed area; 500. second electrode; 501. recessed area; 502. protruding area; 503. flat area; 600. first encapsulation layer; 700. color film layer; 800. second encapsulation layer; 900. transparent cover plate.

Figure 9:
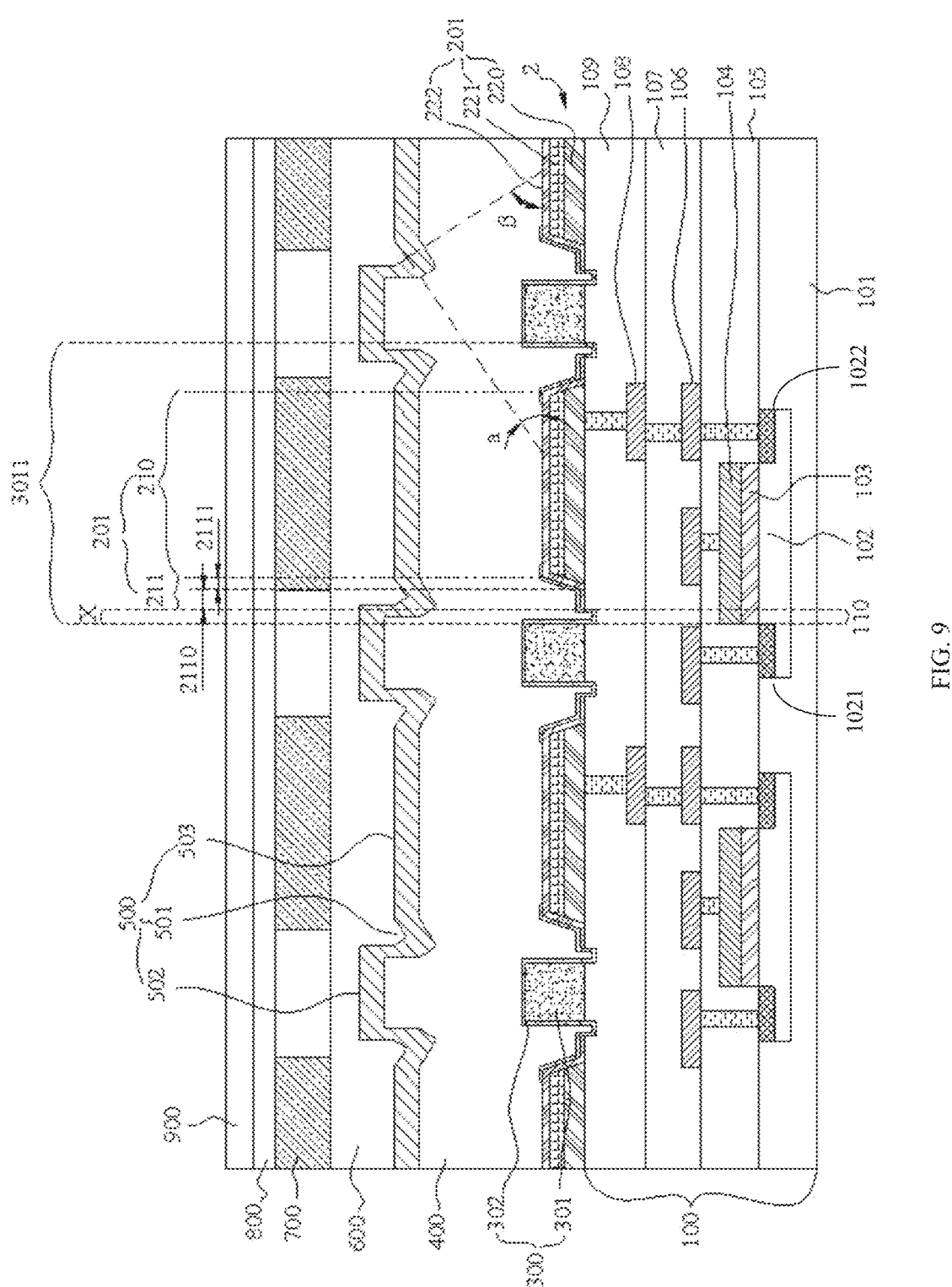
FIG. 9 is a schematic diagram of an embodiment of the third display panel of the present disclosure.
Figure 10:
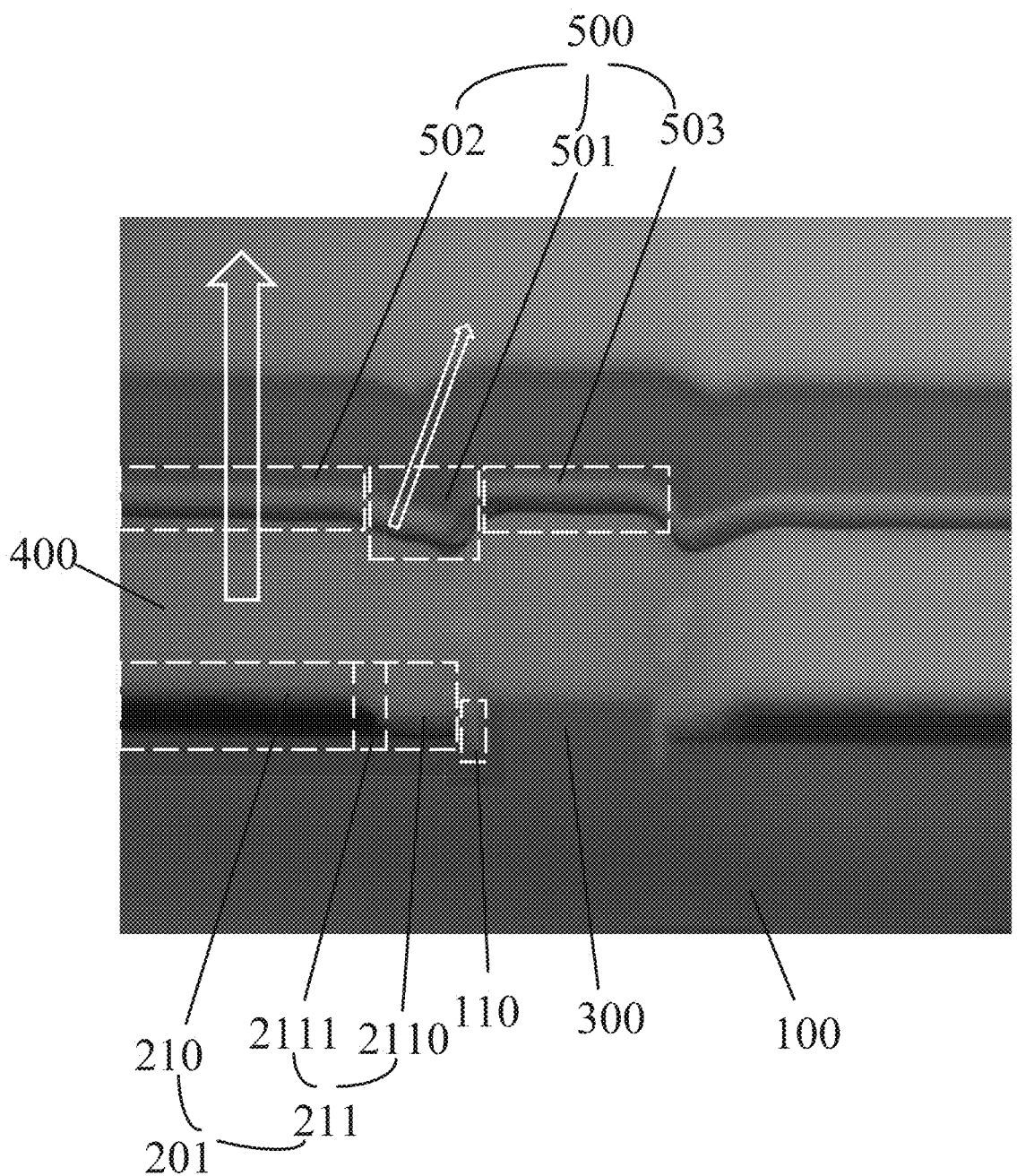
FIG. 10 is an electron micrograph of an embodiment of the third display panel of the present disclosure.

In FIG. 9 and FIG. 10:

100. drive backplane; 101. substrate; 102. active area; 1021. source; 1022. drain; 103. gate insulating layer; 104. gate; 105. first insulating layer; 106. first wiring layer; 107. second insulating layer; 108. second wiring layer; 109. planarization layer; 110. annular groove; 200. first electrode layer; 201. first electrode; 210. middle part; 211. edge part; 2110. horizontal part; 2111. climbing part; 220. first conductive layer; 221. second conductive layer; 222. third conductive layer; 300. leakage cut-off layer; 301. first defining layer; 3011. opening; 302. second defining layer; 400. light-emitting function layer; 500. second electrode; 501. recessed area; 502. protruding area; 503. flat area; 600. first encapsulation layer; 700. color film layer; 800. two encapsulation layer; 900. transparent cover plate.

The first display panel

As shown in FIGS. 1 to 3, the display panel may include a drive backplane 1, a first electrode layer 2, a light-emitting function layer 3 and a second electrode 4.

The first electrode layer 2 is provided on a surface of the drive backplane 1, and includes a plurality of first electrodes 21 distributed in an array. The first electrode 21 includes a flat middle part 210 and an edge part 211 surrounding the middle part 210. The edge part 211 includes a horizontal part 2110 surrounding the middle part 210, and a climbing part 2111 connected between the middle part 210 and the horizontal part 2110, and a thickness of the horizontal part 2110 is smaller than that of the middle part 210.

The light-emitting function layer 3 at least partially covers the first electrode 21.

The second electrode 4 covers the light-emitting function layer 3, and includes a separating part 41 and a plurality of flat parts 42 separated by the separating part 41. Orthographic projections of the respective flat parts 42 on the drive backplane 1 are positioned within orthographic projections of the first electrodes in one-to-one correspondence. The separating part 41 includes a protruding area 411 and first recessed areas 412 connecting the protruding area 411 and the flat parts 42. The first recessed areas 412 are recessed toward a side of the flat parts 42 close to the drive backplane 1, and the protruding area 411 protrudes toward a side of the flat parts 42 facing away from the drive backplane 1. Orthographic projections of the first recessed areas 412 on the drive backplane 1 are at least partially located outside orthographic projections of the middle parts 210 of the first electrode 21.

In the display panel of the embodiment of the present disclosure, each first electrode 21 and its corresponding light-emitting function layer 3 and second electrode 4 can constitute a light-emitting device, which can emit light. By making the orthographic projections of the first recessed areas 412 of the second electrodes 4 on the drive backplane 1 at least partially located outside orthographic projections of the first electrodes 21 and not directly face the first electrodes 21, the risk of tip discharge between the first recessed areas 412 and the first electrodes 21 can be reduced, which helps to ensure that the light-emitting device emits light stably. At the same time, light emission within the range of the first recessed areas 412 can be reduced, thereby reducing the mutual interference of the light emission of adjacent light-emitting devices.

As shown in FIG. 2, FIG. 2 is a partial electron micrograph of an embodiment of the first display panel of the present disclosure. It can be seen that the orthographic projections of the first recessed areas 412 on the drive backplane 1 are at least partially located outside the range of orthographic projections of the first electrodes 21, which can reduce the risk of a tip discharge with the first electrode 21. At the same time, the light emission of the first recessed areas 412 can be reduced or even avoided, and thus interference to adjacent sub-pixels can be prevented.

Each part of the display panel of the present disclosure will be described in detail below:

As shown in FIG. 1, the drive backplane 1 may include a plurality of drive transistors for driving the respective light-emitting devices to emit light to display an image. Taking a drive transistor with a top gate structure as an example, the drive backplane 1 includes a substrate 101, a gate insulating layer 103, a gate 104, a first insulating layer 105, and a first wiring layer 106. The material of the substrate 101 may be Monocrystalline silicon or polycrystalline silicon, etc., which are not particularly limited here. The substrate 101 may include an active area 102 and a source 1021 and a drain 1022 located at the two ends of the active area 102. The gate insulating layer 103 covers the active area 102; and the gate 104 is provided on a surface of the gate insulating layer 103 facing away from the substrate 101. The first insulating layer 105 covers the gate 104 and the substrate 101, and its material may include at least one of silicon oxide and silicon nitride. The first wiring layer 106 is disposed on a surface of the first insulating layer 105 facing away from the substrate 101, and the gate 104, the source 1021 and the drain 1022 are all connected to the first wiring layer 106 through via holes filled with tungsten or other metals.

In addition, the drive backplane 1 may further include a second insulating layer 107 and a second wiring layer 108. The second insulating layer 107 covers the first wiring layer 106 and the first insulating layer 105. The second wiring layer 108 is provided on the first wiring layer. The second wiring layer 108 is provided on a surface of the second insulating layer 107 facing away from the substrate 101. The specific pattern of the second wiring layer 108 is not particularly limited here, and the second wiring layer 108 can be connected to the first wiring layer 106 through via holes filled with tungsten or other metals. At the same time, the second wiring layer 108 may be covered with a planarization layer 109, the first electrode layer 2 may be provided on a surface of the planarization layer 109 facing away from the substrate 101, and the first electrode 21 may be connected to the wiring layer 108 through via holes filled with tungsten or other metals.

As shown in FIG. 1, the first electrode layer 2 is provided on one side of the drive backplane 1 and includes a plurality of first electrodes 21, and the first electrodes 21 are distributed in an array. For example, the first electrodes 21 of the first electrode layer 2 are arranged in an array on a surface of the planarization layer 109 facing away from the substrate 101, and adjacent first electrodes 21 are arranged at intervals.

In a direction parallel to the drive backplane 1, the first electrode 21 may include a middle part 210 and an edge part 211 surrounding the middle part 210. The middle part 210 has a flat structure, that is, the middle part 210 is substantially parallel to the drive backplane 1. For example, the middle part 210 is provided on a surface of the planarization layer 109 facing away from the substrate 101 and parallel to the surface of the planarization layer 109 facing away from the substrate 101.

The edge part 211 may include a horizontal part 2110 and a climbing part 2111. The horizontal part 2110 is located on the drive backplane 1 and arranged surrounding the middle part 210, and the horizontal part 2110 is substantially parallel to the drive backplane 1. For example, the horizontal part 2110 is located on a surface of the planarization layer 109 facing away from the substrate 101 and parallel to the surface of the planarization layer 109 facing away from the substrate 101. At the same time, the thickness of the horizontal part 2110 is smaller than the thickness of the middle part 210.

The climbing part 2111 is connected between the middle part 210 and the horizontal part 2110, that is, the climbing part 2111 surrounds the middle part 210, the horizontal part 2110 is arranged surrounding the climbing part 2111, and a slope of the climbing part 2111 relative to the drive backplane 1 is not less than 30°, and the slope is an angle between a surface of the climbing part 2111 and the drive backplane 1.

In some embodiments of the present disclosure, in a direction perpendicular to the drive backplane 1, the first electrode 21 may have a multilayer structure. For example, the first electrode 21 may include a first conductive layer 220, a second conductive layer 221 and a third conductive layer 222.

The first conductive layer 220 is provided on a surface of the planarization layer 109 facing away from the substrate 101. The second conductive layer 221 is provided on a surface of the first conductive layer 220 facing away from the drive backplane 1. The third conductive layer 222 is provided on a surface of the second conductive layer 221 facing away from the drive backplane 1, and extends to the drive backplane 1 at a certain slope, and then extends a certain distance along the drive backplane 1, thus covering the first conductive layer 220 and the second conductive layer 221, to protect the first conductive layer 220 and the second conductive layer 221. Exemplarily, the material of the first conductive layer 220 may include titanium (Ti), the material of the second conductive layer 221 may include silver (Ag), and the material of the third conductive layer 222 may include indium tin oxide (ITO).Each of the conductive layers may adopt other materials as well.

The middle part 210 of the first electrode 21 includes an area of the third conductive layer 222 located on the surface of the second conductive layer 221 facing away from the drive backplane 1, and the first conductive layer 220 and the second conductive layer 220 within the range of an orthographic projection of the area on the drive backplane 1. The horizontal part 2110 includes an area of the third conductive layer 222 extending along the drive backplane 1. The climbing part 2111 includes an area of the third conductive layer 222 extending toward the drive backplane 1 with a certain slope, and the first conductive layer 220 and the second conductive layer 221 within the range of an orthographic projection of the area on the drive backplane 1.

As shown in FIG. 1, the light-emitting function layer 3 may be a continuous film layer, and simultaneously covers at least a part of the area of each first electrode 21. In some embodiments of the present disclosure, the light-emitting function layer 3 includes one light-emitting unit layer, and the light-emitting unit layer includes a hole injection layer, a hole transport layer, a light-emitting layer, an electron transport layer and an electron injection layer that are sequentially stacked from the first electrode 21 in a direction facing away from the drive backplane 1.

In another embodiment of the present disclosure, the light-emitting function layer 3 includes a plurality of light-emitting unit layers, and the distribution manners of the hole injection, the hole transport layer, the light-emitting layer, the electron transport layer, and the electron injection layer of the respective light-emitting unit layers are the same. At the same time, a charge generation layer is provided between two adjacent light-emitting unit layers, such that the respective light-emitting unit layers are connected in series through the charge generation layers, so as to form a series-type OLED light-emitting device.

As shown in FIG. 1, the second electrode 4 covers the light-emitting function layer 3. A driving signal can be applied to the first electrode 21 and the second electrode 4, such that the part of the light-emitting function layer 3 located between the first electrode 21 and the second electrode 4 can emit light. The second electrode 4 includes a separating part 41 and a plurality of flat parts 42, wherein:

The flat parts 42 are arranged in an array, and are arranged in one-to-one correspondence with the middle parts 210 of the respective first electrode 21, that is, orthographic projections of the respective flat parts 42 on the drive backplane 1 are located within orthographic projections of the middle part 210 of the respective first electrodes 21 in one-to-one correspondence. The flat part 42 is parallel or substantially parallel to the middle part 210.

The separating part 41 corresponds to the area of the drive backplane 1 that is not covered by the middle parts 210, and is used to separate the flat parts 42. The separating part 41 includes a protruding area 411 and first recessed areas 412.

The protruding area 411 protrudes toward a side of the flat parts 42 facing away from the drive backplane 1, and the first recessed areas 412 are recessed toward a side of the flat parts 42 close to the drive backplane 1. The first recessed areas 412 are connected between the protruding area 411 and the flat parts 42, that is, the first recessed areas 412 have annular structures, the number of the first recessed areas 412 is multiple, and the respective first recessed areas 412 surround the flat parts 42 in one-to-one correspondence, and are connected to the protruding area 411, that is, the first recessed areas 412 are transition areas of the protruding area 411 and the flat parts 42.

The orthographic projections of the first recessed areas 412 on the drive backplane 1 are at least partially located outside the orthographic projections of the middle part 210 of the first electrode 21, so as to face the areas outside the first electrodes 21, or face the edge parts 211 with a smaller thickness, but not face the middle parts 210 with a larger thickness, which can reduce the risk of tip discharge and short circuit between the first recessed areas 412 of the second electrode 4 and the first electrodes 21, thereby improving the stability of the light-emitting device.

In some embodiments of the present disclosure, on a cross-section perpendicular to the drive backplane 1, an orthographic projection of a lowest point of the first recessed area 412 on the drive backplane 1 is located outside the orthographic projection of the middle part 210, for example, the lowest point faces one of the climbing part 2111 and the horizontal part 2110, so as to avoid the occurrence of tip discharge with the middle part 210. The lowest point of the first recessed area 412 on the cross-section perpendicular to the drive backplane 1 is: on the cross-section perpendicular to the drive backplane 1, a point of the first recessed area 412 that is closest to the first electrode 21, that is, a point that is farthest from the flat part 42.

It should be noted that, in the embodiment of the present disclosure, the number of the cross-sections perpendicular to the drive backplane 1 of the first recessed area 412 may be multiple, and the lowest points on different cross-sections may be different. For example, the lowest point may be the point closest to the first electrode 21 in the depth direction, or other points in the depth direction, depending on the position of the cross-section perpendicular to the driving back plate 1.

As shown in FIG. 1, in some embodiments of the present disclosure, the first recessed area 412 has two side surfaces, including a first side surface 4121 and a second side surface 4122. The first side surface 4121 is connected to the flat part 42, and the second side surface 4122 is connected to the protruding area 411. The first side surface 4121 and the second side surface 4122 may shrink in a direction approaching the drive backplane 1. The first side surface 4121 and the second side surface 4122 may be curved or flat, which is not specifically limited here.

Further, as shown in FIG. 1, in some embodiments of the present disclosure, a width S of the orthographic projection of the first recessed area 412 on the drive backplane 1 is not greater than 0.2 μm, that is, the maximum width of the first recessed area 412 is not greater than 0.2 μm, for example, it is 0.1 μm or 0.2 μm, and so on, so as to avoid that the width of the first recessed area 412 is too large that makes the orthographic projection of the first recessed area 412 on the drive backplane 1 have an overlap area with the orthographic projection of the first electrode 21, or the overlap area is too large, thereby further preventing the occurrence of tip discharge.

Further, as shown in FIG. 1, in some embodiments of the present disclosure, a depth of the first recessed area 412 is less than twice the maximum thickness of the second electrode 4. For example, the maximum thickness of the second electrode 4 is 90 nm. The depth of the first recessed area 412 is less than 180 nm, for example, the depth of the first recessed area 412 is 120 nm, 100 nm, 80 nm, 70 nm, 60 nm, 50 nm, or 40 nm, and so on. The depth of the first recessed area 412 refers to the maximum depth of the first recessed area 412, that is, in the direction perpendicular to the drive backplane 1, a distance between the point of the first recessed area 412 closest to the drive backplane 1 and the surface of the flat part 42 facing away from the drive backplane 1.

Further, in some embodiments of the present disclosure, the orthographic projection of each first recessed area 412 on the drive backplane 1 surrounds outside the orthographic projection of the middle part 210 of one first electrode 21, and the minimum value of a distance between the bottom of the first recessed area 412 and the middle part 210 of the adjacent first electrode 21 (in the direction perpendicular to the drive backplane 1, a distance between the point of the first recessed area 412 that is closest to the middle part 210 and the middle part 210) is not less than 70% of a total thickness of the flat part 42 and the light-emitting function layer 3. The total thickness of the flat part 42 and the light-emitting function layer 3 is the sum of the thicknesses of the flat part 42 and the light-emitting function layer 3. For example, the total thickness of the flat part 42 and the light-emitting function layer 3 is about 365 nm, the minimum value of a distance between the bottom of the first recessed area 412 in the direction perpendicular to the drive backplane 1 and the middle part 210 of the adjacent first electrode 21 is not less than 255 nm .

Further, the maximum value of the minimum value of the distance between the bottom of the first recessed area 412 and the middle part 210 of the adjacent first electrode 21 (in the direction perpendicular to the drive backplane 1, a distance between the point of the first recessed area 412 that is closest to the middle part 210 and the middle part 210) is not less than 400 nm, and the minimum value is not more than 450 nm .

Further, as shown in FIG. 1, a slope of the first side surface 4121 relative to the middle part 210 of the first electrode 21 is smaller than a slope of the second side surface 4122 relative to the middle part 210, that is, the first side surface 4121 is gentler than the second side surface 4122. For example, the slope of the first side surface 4121 relative to the middle part 210 may be less than 60°, for example, may be 50°, 45°, 40°, 30°, etc., and the slope of the second side surface 4122 relative to the middle part 210 is not less than 60° and not more than 90°, for example, may be 60°, 75°, 90°, etc. The slope of the first side surface 4121 relative to the middle part 210 is: an angle a between an extension surface of the first side surface 4121 and an extension surface of the surface of the middle part 210 facing away from the drive backplane 1. The slope of the second side surface 4122 relative to the middle part 210 is: an angle β between an extension surface of the second side surface 4122 and an extension surface of the surface of the middle part 210 facing away from the drive backplane 1.

Further, in some embodiments of the present disclosure, the slope of the first side surface 4121 relative to the middle part 210 is smaller than the slope of the second side surface 4122 relative to the middle part 210, and a minimum thickness of an area of the second electrode 4 corresponding to the first side surface 4121 is greater than a minimum thickness of an area of the second electrode 4 corresponding to corresponding to the second side surface 4122.

In other embodiments of the present disclosure, the slope of the first side surface 4121 relative to the middle part 210 may be equal to the slope of the second side surface 4122 relative to the middle part 210 as well.

In order to facilitate the formation of the second electrode 4 above, in some embodiments of the present disclosure, the display panel of the present disclosure further includes a leakage cut-off layer 5. The leakage cut-off layer 5 is made of insulating material, and is provided with the first electrode layer 2 on the same surface of the drive backplane 1. The leakage cut-off layer 5 at least partially exposes the respective first electrodes 21. For example, the leakage cut-off layer 5 is provided with a plurality of openings that at least partially expose the middle parts 210. The light-emitting function layer 3 covers the leakage cut-off layer 5 and extends into the openings, so as to cover at least a part of each of the middle parts 210. Through the leakage cut-off layer 5, the light-emitting function layer 3 can be provided with pits for forming the first recessed areas 412 of the second electrode 4.

As shown in FIGS. 1 and 2, in some embodiments of the present disclosure, the leakage cut-off layer 5 includes a first defining layer 51 and a second defining layer 52.

The first defining layer 51 and the first electrode layer 2 are provided on the same surface of the drive backplane 1, the first defining layer 51 has a plurality of openings 511, and the respective first electrodes 21 are provided in the openings 511 in one-to-one correspondence. Between the edge part 211 of each first electrode 21 and a sidewall of the opening 511 where the first electrode 21 is located, a space area X exposing the drive backplane 1 is formed.

In some embodiments of the present disclosure, the materials of the planarization layer 109, the first defining layer 51 and the second defining layer 52 may include silicon oxide and silicon nitride, and the materials of the three ones are the same, for example: all of the planarization layer 109, the first defining layer 51 and the second defining layer 52 are silicon oxide. When the first defining layer 51 is formed by an etching process, the position of the space area X is over-etched, and the over-etched area extends along the sidewall of the opening 511 into the drive backplane 1, such that at least a part area of the drive backplane 1 located in the space area X is etched as well, to form an annular groove 110, that is, the planarization layer 109 is etched.

The second defining layer 52 covers the first defining layer 51 and an area of the drive backplane 1 that is located in the space area X, and at least partially exposes the middle part 210 of the first electrode 21. The second defining layer 52 is recessed toward the drive backplane 1 in the space area X and an area corresponding to the edge part 211, and a thickness of the second defining layer 52 is smaller than a thickness of the first defining layer 51.

The light-emitting function layer 3 covers the second defining layer 52. Due to limitation of the evaporation process, the light-emitting function layer 3 forms pits in the areas corresponding to the space areas X and the edge parts 211. The second electrode 4 is recessed at the pits, to form the first recessed areas 412, such that the orthographic projections of the first recessed areas 412 on the drive backplane 1 are at least partly located within the range of the orthographic projections of the space areas X or the edge parts 211, so as to be located outside the middle parts 210, thus to avoid discharge between the first recessed areas 412 and the middle parts 210. Further, orthographic projections of the lowest points of the first recessed areas 412 on the cross-sections perpendicular to the drive backplane 1, on the drive backplane 1, are located within the range of the orthographic projections of the space areas X or the edge parts 211.

As shown in FIG. 3, in some other embodiments of the present disclosure, the leakage cut-off layer 5 includes a first defining layer 51 and a second defining layer 52 of other structure forms.

The first defining layer 51 and the first electrode layer 2 are arranged on the same surface of the drive backplane 1, and the second defining layer 52 is disposed on a surface of the first defining layer 51 facing away from the drive backplane 1. Both the first defining layer 51 and the second defining layer 52 at least partially expose the middle part 210 of the first electrode 21. An orthographic projection of the first defining layer 51 on the drive backplane 1 abuts an orthographic projection of the edge of the edge part 211, or covers the edge part 211 and the edge of the middle part 210. The edge of an orthographic projection of the layer 52 on the drive backplane 1 is located outside the orthographic projection of the middle part 210, such that the second defining layer 52 can be regarded as a ridge formed on a surface of the first defining layer 51 facing away from the driving backboard 1.

The light-emitting function layer 3 covers the second defining layer 52. Due to limitation of the evaporation process, the light-emitting function layer 3 forms a pit at an area where the second defining layer 52 exposes the first electrode 21, the pit faces an area of the first defining layer 51 not covered by the second defining layer 52, and an orthographic projection of the pit on the drive backplane 1 is located outside the orthographic projection of the middle part 210 of the first electrode 21. At the same time, the light-emitting function layer 3 forms a convex structure at the position corresponding to the second defining layer 52.

The above-mentioned first defining layer 51 and second defining layer 52 can be made of the same material, and can be formed by a single patterning process, or, the first defining layer 51 and the second defining layer 52 may be formed separately as well, and may adopt different materials.

When the second electrode 4 covers the light-emitting function layer 3, the second electrode 4 are recessed in the pits of the light-emitting function layer 3, to form the first recessed areas 412, and a protruding area 411 is formed at the position of the convex structure. The orthographic projection of the first recessed area 412 on the drive backplane 1 is located between the orthographic projections of the middle part 210 and the second defining layer 52 on the drive backplane 1, and an orthographic projection of the second defining layer 52 on the leakage cut-off layer 5 is located within an orthographic projection of the protruding area 411 on the leakage cut-off layer 5.

In some embodiments of the present disclosure, the protruding area 411 has a second recessed area 4111 recessed toward the drive backplane 1, and the depth of the second recessed area 4111 is smaller than the depth of the first recessed area 412.

In addition, as shown in FIGS. 1 and 3, the first display panel of the present disclosure may further include a first encapsulation layer 6, a color film layer 7, a second encapsulation layer 8 and a transparent cover plate 9.

The first encapsulation layer 6 may cover the second electrode 4, for example, the first encapsulation layer 6 may include two inorganic layers and an organic layer between the two inorganic layers.

The color filter layer 7 is arranged on a side of the first encapsulation layer 6 facing away from the second electrode 4, and the color filter layer 7 includes filter areas in one-to-one correspondence with the respective first electrodes 21. The filter areas have a plurality of colors, such as red, blue, and green.

The second encapsulation layer 8 can cover the color film layer 7, and its structure can be the same as that of the first encapsulation layer 6.

The transparent cover plate 9 can cover the second encapsulation layer 8, and its material may be glass or other materials.

The second display panel

Figure 4:
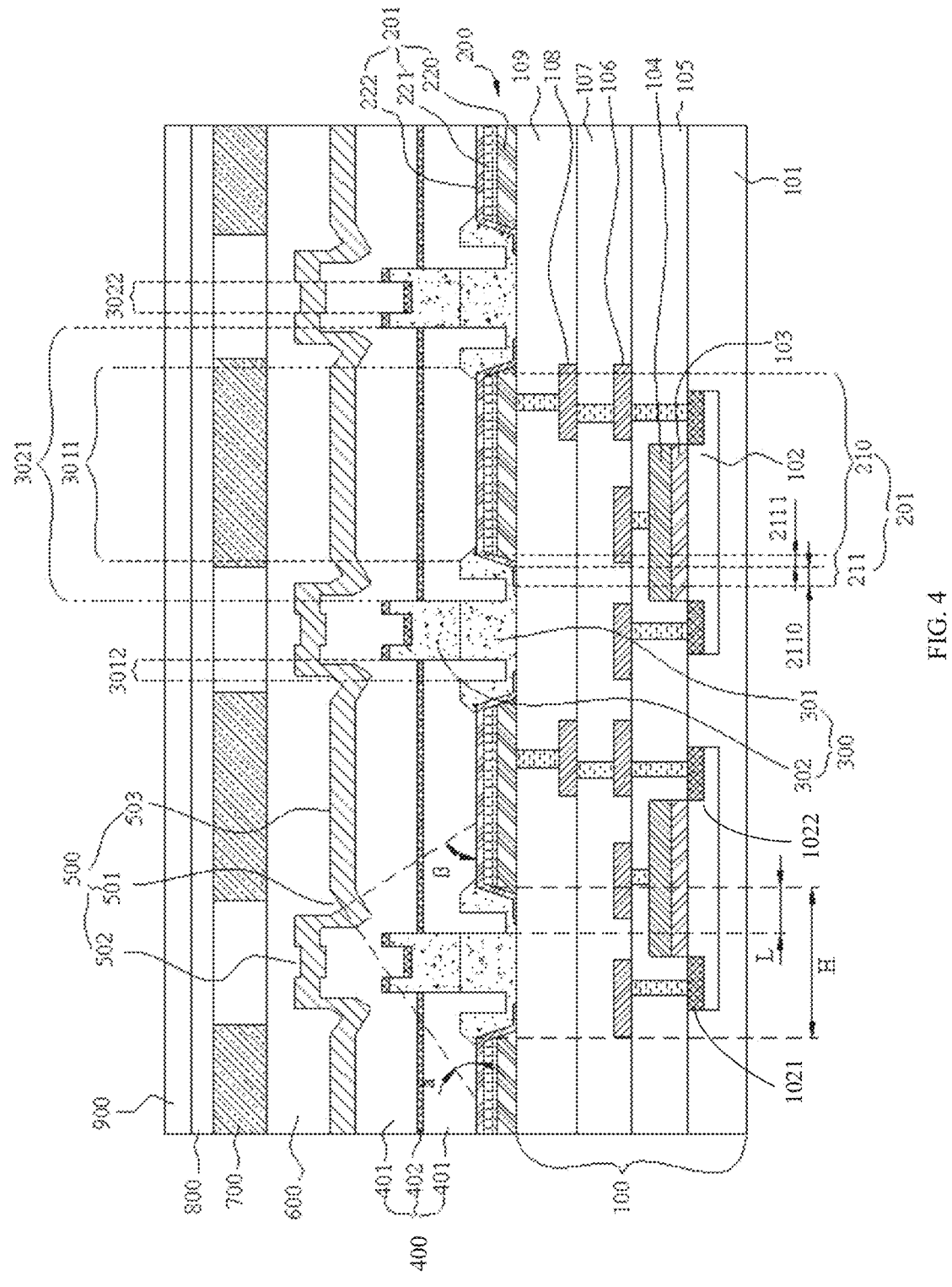
FIG. 4 is a schematic diagram of the first embodiment of the second display panel of the present disclosure.

As shown in FIG. 4, the display panel includes a drive backplane 100, a first electrode layer 200, a leakage cut-off layer 300, a light-emitting function layer 400 and a second electrode 500, wherein:

The first electrode layer 200 is provided on a surface of the drive backplane 100, and includes a plurality of first electrodes 201 distributed in an array, the first electrode 201 includes a flat middle part 210 and an edge part 211 surrounding the middle part 210, the edge part 211 includes a horizontal part 2110 surrounding the middle part 210, and a climbing part 2111 connected between the middle part 210 and the horizontal part 2110, and the thickness of the horizontal part 2110 is smaller than that of the middle part 210.

Figure 6:
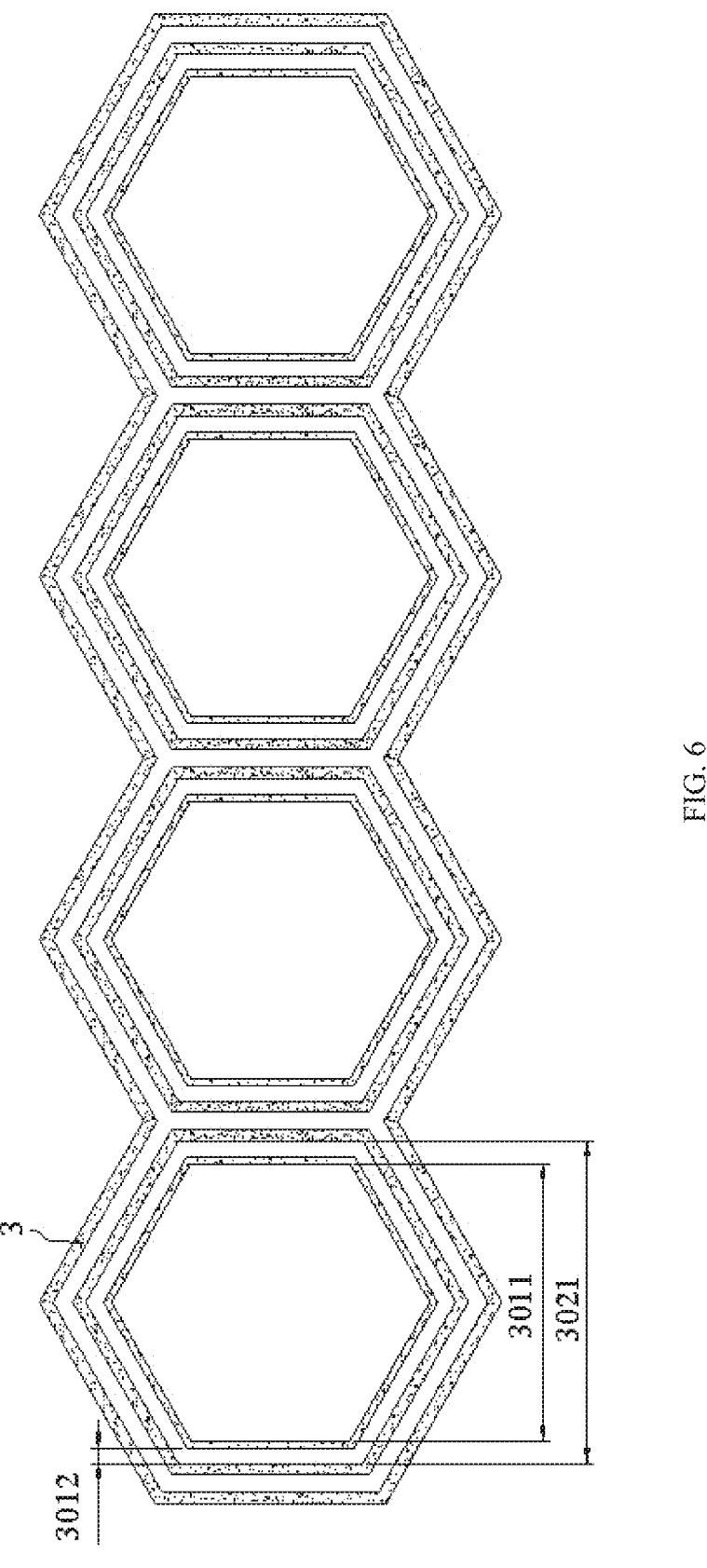
FIG. 6 is a top view of the leakage cut-off layer in an embodiment of the second display panel of the present disclosure.
Figure 7:
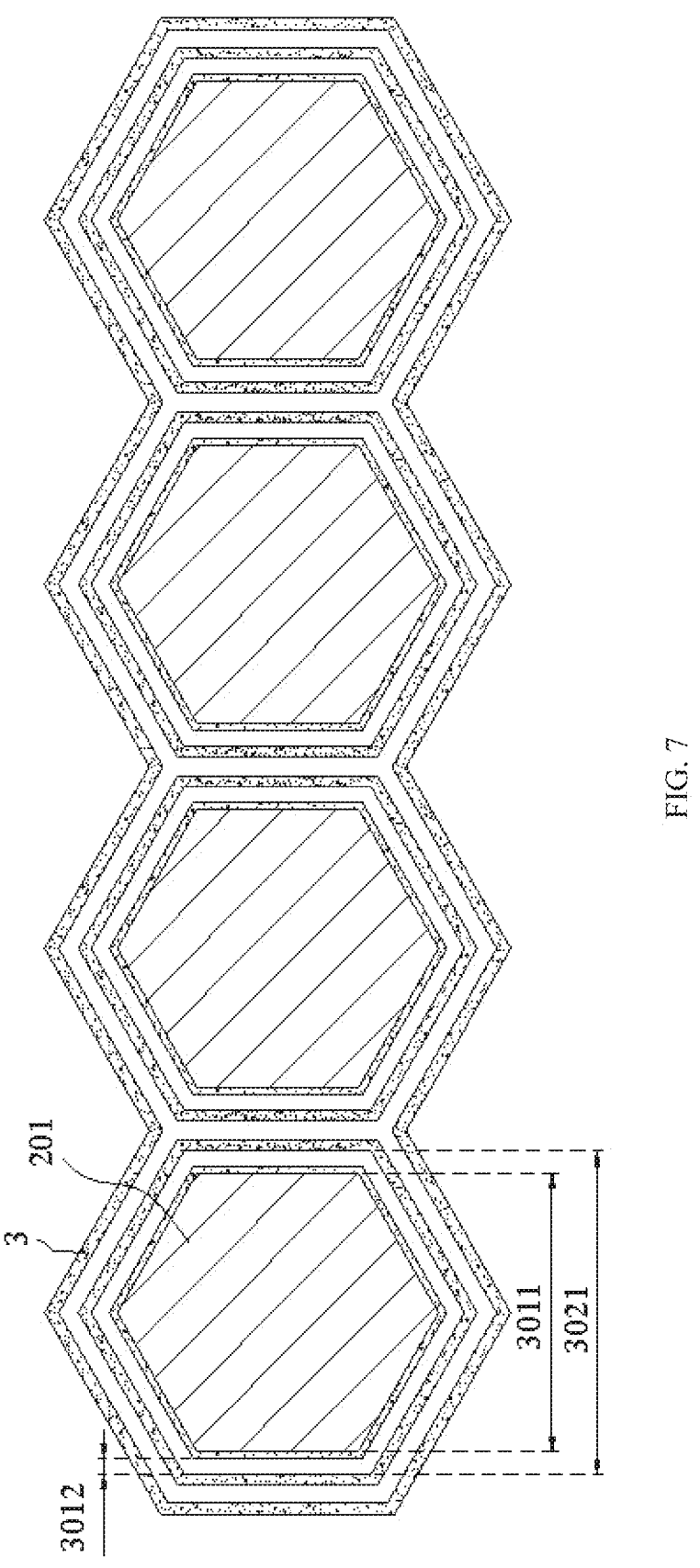
FIG. 7 is a top view of the leakage cut-off layer and the first electrode in an embodiment of the second display panel of the present disclosure.

The leakage cut-off layer 300 and the first electrode layer 200 are provided on the same surface of the drive backplane 100, and the leakage cut-off layer 300 includes a first defining layer 301 and a second defining layer 302 laminated in a direction facing away from the drive backplane 100. The first defining layer 301 is provided with first openings 3011 exposing the middle parts 210 of the respective first electrodes 201 in one-to-one correspondence. The second defining layer 302 is provided with second openings 3021 respectively surrounding the first openings 3011 at positions corresponding to the first openings 3011. An orthographic projection of the second defining layer 302 on the drive backplane 100 and orthographic projections of the middle parts 210 are spaced by intervals. The first defining layer 301 is provided with a plurality of annular holes 3012, which are of blind hole structure, surrounding the respective first openings 3011 in one-to-one correspondence, as shown in FIGS. 6-7. The second defining layer 302 is disposed on a surface of the first defining layer 301 facing away from the drive backplane 100, and is located outside the annular hole 3012.

The light-emitting function layer 400 at least partially covers the leakage cut-off layer 300 and the middle parts 210 of the first electrodes 201.

The second electrode 500 covers the light-emitting function layer 400.

In the display panel of the embodiment of the present disclosure, each first electrode 201 and its corresponding light-emitting function layer 400 and second electrode 500 can constitute a light-emitting device to emit light.

Since the second opening 3021 surrounds outside the first opening 3011, that is, the second opening 3021 is larger than the first opening 3011, the two openings can form a stepped hole, such that the first defining layer 301 has an area located in the second opening 3021 and exposed by the second opening 3021. At the same time, since the orthographic projection of the second defining layer 302 on the drive backplane 100 and the orthographic projections of the middle parts 210 of the first electrodes 201 are spaced by intervals, and the orthographic projection of the second defining layer 302 on the drive backplane 100 is located outside the annular holes 3012, if the light-emitting function layer 400 is formed with pits in areas contacting the sidewalls of the second openings 3021 due to process reasons, the pit may at least partially face the annular hole 3012 of the first defining layer 301 exposed by the second opening 3021, and may not face the middle part 210 of the first electrode 201.

Correspondingly, the lowest point of the recessed area 501 of the second electrode 500 formed after the second electrode 500 is recessed in the pit, on the cross-section perpendicular to the drive backplane 100, does not face the middle part 210, that is, an orthographic projection of the lowest point of the recessed area 501 of the second electrode 500 on the cross-section perpendicular to the drive backplane 100, on the drive backplane 100, is located outside the orthographic projection of the middle part 210, that is, outside an orthographic projection of the light-emitting device, such that it can prevent a tip discharge or even a short-circuit occurring between the recessed area 501 and the middle part 210 of the first electrode 201, which helps to ensure that the light-emitting device emits light stably. At the same time, light emission within the range of the recessed area 501 can be avoided, thereby reducing mutual interference of light emission of adjacent light-emitting devices.

Each part of the second display panel of the embodiment of the present disclosure will be described in detail below.

As shown in FIG. 4, the drive backplane 100 may include a plurality of drive transistors for driving the respective light-emitting device to emit light to display an image. Taking a drive transistor with a top gate structure as an example, the drive backplane 100 includes a substrate 101, a gate insulating layer 103, a gate 104, a first insulating layer 105 and a first wiring layer 106. The material of the substrate 101 may be Monocrystalline silicon or polycrystalline silicon, etc., which are not particularly limited here. The substrate 101 may include an active area 102 and a source 1021 and a drain 1022 located at the two ends of the active area 102. The gate insulating layer 103 covers the active area

102, and the gate 104 is provided on a surface of the gate insulating layer 103 facing away from the substrate 101. The first insulating layer 105 covers the gate 104 and the substrate 101, and its material may include at least one of silicon oxide and silicon nitride. The first wiring layer 106 is disposed on a surface of the first insulating layer 105 facing away from the substrate 101, and the gate 104, the source 1021 and the drain 1022 are all connected to the first wiring layer 106 through via holes filled with tungsten or other metals.

In addition, the drive backplane 100 may further include a second insulating layer 107 and a second wiring layer 108. The second insulating layer 107 covers the first wiring layer 106 and the first insulating layer 105. The second wiring layer 108 is provided on a surface of the second insulating layer 107 facing away from the substrate 101. The specific pattern of the second wiring layer 108 is not particularly limited here, and it can be connected to the first wiring layer 106 through via holes filled with tungsten or other metals. At the same time, the second wiring layer 108 can be covered with a planarization layer 109, the first electrode layer 200 can be provided on a surface of the planarization layer 109 facing away from the substrate 101, and the first electrode 201 can be connected to the second wiring layer 108 through via holes filled with tungsten or other metals.

As shown in FIG. 4, the first electrode layer 200 is disposed on a surface of the drive backplane 100, and includes a plurality of first electrodes 201, and the first electrodes 201 are distributed in an array. For example, the respective first electrodes 201 of the first electrode layer 200 are arranged in an array on a surface of the planarization layer 109 facing away from the substrate 101, and the adjacent first electrodes 201 are spaced by intervals.

In a direction parallel to the drive backplane 100, the first electrode 201 may include a middle part 210 and an edge part 211 surrounding the middle part 210. The middle part 210 has a flat structure, that is, the middle part 210 and the drive backplane 100 are substantially parallel. For example, the middle part 210 is provided on the surface of the planarization layer 109 facing away from the substrate 101, and parallel to the surface of the planarization layer 109 facing away from the substrate 101.

The edge part 211 may include a horizontal part 2110 and a climbing part 2111. The horizontal part 2110 is located on the drive backplane 100 and arranged surrounding the middle part 210, and the horizontal part 2110 is substantially parallel to the drive backplane 100. For example, the horizontal part 2110 is located on the surface of the planarization layer 109 facing away from the substrate 101 and parallel to the surface of the planarization layer 109 facing away from the substrate 101. At the same time, the thickness of the horizontal part 2110 is smaller than the thickness of the middle part 210.

The climbing part 2111 is connected between the middle part 210 and the horizontal part 2110, that is, the climbing part 2111 surrounds the middle part 210, and the horizontal part 2110 is arranged surrounding the climbing part 2111. A slope of the climbing part 2111 relative to the drive backplane 100 is not less than 30°, and the slope is an angle between the surface of the climbing part 2111 and the drive backplane 100.

In some embodiments of the present disclosure, the first electrode 201 includes a flat middle part 210 and an edge part 211 surrounding the middle part 210, and the orthographic projection of the lowest point of the recessed area 501 on the cross-section perpendicular to the drive backplane 100, on the drive backplane 100, is located outside the orthographic projection of the middle part 210 of the first electrode 201.

The first electrode 201 includes a first conductive layer 220, a second conductive layer 221 and a third conductive layer 222. The first conductive layer 220 is provided on the surface of the planarization layer 109 facing away from the substrate 101, the second conductive layer 221 is provided on a surface of the first conductive layer 220 facing away from of the drive backplane 100, and the third conductive layer 222 is provided on a surface of the second conductive layer 221 facing away from the drive backplane 100 and extends to the drive backplane 100 at a certain slope, thereby covering the first conductive layer 220 and the second conductive layer 221, so as to protect the first conductive layer 220 and the second conductive layer 221.

The middle part 210 of the first electrode 21 includes an area of the third conductive layer 222 located on the surface of the second conductive layer 221 facing away from the drive backplane 1, and the first conductive layer 220 and the second conductive layer 220. The edge part 211 includes an area of the third conductive layer 222 covering the edge of the first conductive layer 220 and the second conductive layer 221, that is, an area extending toward the drive backplane 100. Exemplarily, the material of the first conductive layer 220 may include titanium (Ti), the material of the second conductive layer 221 may include silver (Ag), and the material of the third conductive layer 222 may include indium tin oxide (ITO). Each of the conductive layers may adopt other materials as well.

As shown in FIG. 4, the leakage cut-off layer 300 is made of insulating material, and is provided on the same surface of the drive backplane 100 as the first electrode layer 200, for example, on the surface of the planarization layer 109 facing away from the substrate 101. The leakage cut-off layer 300 includes a first defining layer 301 and a second defining layer 302, wherein:

The first defining layer 301 and the first electrode layer 200 are provided on the same surface of the drive backplane 100, and the first defining layer 301 is provided with first openings 3011 exposing the respective middle parts 210 in one-to-one correspondence. The first opening 3011 at least exposes a part area of the middle part 210, and the first defining layer 301 covers the edge part 211. In some embodiments of the present disclosure, the first defining layer 301 may cover the edge of the first opening 3011 and may overlap the edge of the middle part 210, and the thickness of the first defining layer 301 may be greater than, equal to, or less than the thickness of the first electrode 201. In addition, in other embodiments of the present disclosure, the first opening 3011 may be smaller than the middle part 210 as well, and the thickness of the first defining layer 301 is greater than the thickness of the middle part 210, such that the first defining layer 301 covers the edge of the middle part 210 and the edge part 211 of the first electrode 201, thereby preventing the burr on the edge of the first electrode 201 from generating a tip discharge.

As shown in FIGS. 6 and 7, the first defining layer 301 may be provided with a plurality of annular holes 3012 surrounding the respective first openings 3011 in one-to-one correspondence. The annular holes 3012 are of blind hole structure, that is, they are recessed toward the drive backplane 100, but do not expose the drive backplane 100. The second defining layer 302 is provided in an area of the surface of the first defining layer 301 facing away from the drive backplane 100 that is not surrounded by the annular hole 3012, that is, the second defining layer 302 is provided outside the annular hole 3012, so as not to occlude the annular hole 3012. By providing the annular hole 3012, it is advantageous to further cut off the charge generation layer 402 of the light-emitting function layer 400, so as to avoid crosstalk between adjacent light-emitting devices.

The second defining layer 302 is provided on the surface of the first defining layer 301 facing away from the drive backplane 100. The orthographic projection of the second defining layer 302 on the drive backplane 100 and the orthographic projections of the middle parts 210 of the first electrodes 201 are spaced by intervals, such that the orthographic projection of the second defining layer 302 on the drive backplane 100 is located outside the orthographic projections of the middle parts 210. At the same time, the second defining layer 302 is provided with a second opening 3021 surrounding the first opening 3011 at a position corresponding to the first opening 3011, such that any one of the first openings 3011 and the second opening 3021 surrounding the first opening 3011 can form a stepped hole, and the second opening 3021 exposes an area of the first defining layer 301 located in the second opening 3021.

The above-mentioned first defining layer 301 and second defining layer 302 can be made of the same material, and can be formed by one single patterning process, or, the first defining layer 301 and the second defining layer 302 can be formed separately as well, and may adopt different materials.

As shown in FIG. 4, the light-emitting function layer 3 may be a continuous film layer, and simultaneously covers at least a part of the middle part 210 of each first electrode 201. In an embodiment of the present disclosure, as shown in FIG. 4, the light-emitting function layer 400 includes a plurality layers of light-emitting unit layers 401, and the distribution manners of the hole injection layer, the hole transport layer, the light-emitting layer, the electron transport layer, and the electron injection layer of the respective light-emitting unit layers 401 are the same. At the same time, a charge generation layer 402 is provided between two adjacent light-emitting unit layers 401, such that the respective light-emitting unit layers 401 are connected in series through the charge generation layer 402, so as to form a series-type OLED light-emitting device.

In other embodiments of the present disclosure, the light-emitting function layer 400 includes one light-emitting unit layer, and the light-emitting unit layer includes a hole injection layer, a hole transport layer, a light-emitting layer, an electron transport layer and an electron injection layer that are sequentially stacked from the first electrode 201 in a direction facing away from the drive backplane 100.

When the light-emitting function layer 400 is formed by an evaporation process, the edge of the part of the light-emitting function layer 400 located in the second opening 3021 is recessed toward the drive backplane 100 along the sidewall of the second opening 3021, to form a pit, and the pit can face the annular hole 3012 exposed by the second opening 3021. At the same time, an area of the light-emitting function layer 400 corresponding to the second defining layer 302 forms a convex structure.

As shown in FIG. 4, the second electrode 500 covers the light-emitting function layer 400. A driving signal can be applied to the first electrode 201 and the second electrode 500, to make the part of the light-emitting function layer 400 located between the first electrode 201 and the second electrode 500 emit light.

The shape of the second electrode 500 matches that of the light-emitting function layer 400, to form recessed areas 501 at the pits of the light-emitting function layer 400, and form a protruding area 502 in the area corresponding to the convex structure of the second defining layer 302. The recessed areas 501 correspond to the annular hole 3012, such that the orthographic projection of the recessed area 501 on the drive backplane 100 is at least partially located outside the orthographic projection of the middle part 210 of the first electrode 201, thus reducing or avoiding tip discharge occurring between the first electrode 201 and the recessed area 501 of the electrode 500. In addition, areas of the second electrode 500 corresponding to the middle parts 210 are flat areas 503. The connection relationship of the recessed areas 501, the protruding area 502 and the flat areas 503 can refer to the protruding area 411, the first recessed areas 412 and the flat parts 42 in the embodiment of the first display panel above, which will not be described in detail here.

Figure 5:
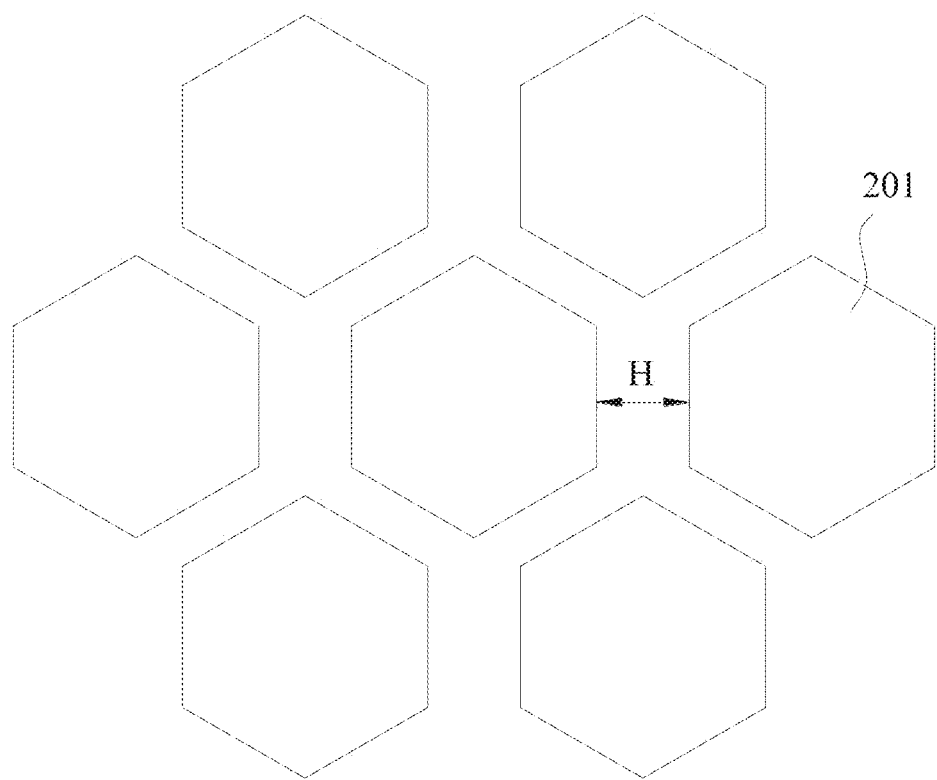
FIG. 5 is a top view of the first electrode layer in an embodiment of the second display panel of the present disclosure.

Further, as shown in FIGS. 4 and 5, in some embodiments of the present disclosure, in order to ensure that an orthographic projection of the lowest point of the recessed area 501 of the second electrode 500 on the cross-section perpendicular to the drive backplane 1, on the drive backplane 100, is completely outside the orthographic projection of the middle part 210, a distance L between the sidewall of the second opening 3021 and the edge of the middle part 210 surrounded by the second opening 3021 in a direction parallel to the middle part 210 is not less than ⅕ of the maximum distance H between the middle parts 210 of two adjacent first electrodes 201. For example, the maximum distance between two adjacent middle parts 210 is 1 μm, then L is 0.2 μm, 0.1 μm, etc., such that the orthographic projection of the recessed area 501 on the first defining layer 301 is located between the orthographic projections of the sidewall of the second opening 3021 and the middle part 210, that is, the orthographic projection of the recessed areas 501 on the drive backplane 100 are completely outside orthographic projections of the middle parts 210, thus further avoiding tip discharge.

In other embodiments of the present disclosure, as shown in FIG. 4, the sidewall of the second opening 3021 may be perpendicular to the drive backplane 100, such that the cross-section of the part of the second defining layer 302 located between two middle parts 210 is rectangular.

Figure 8:
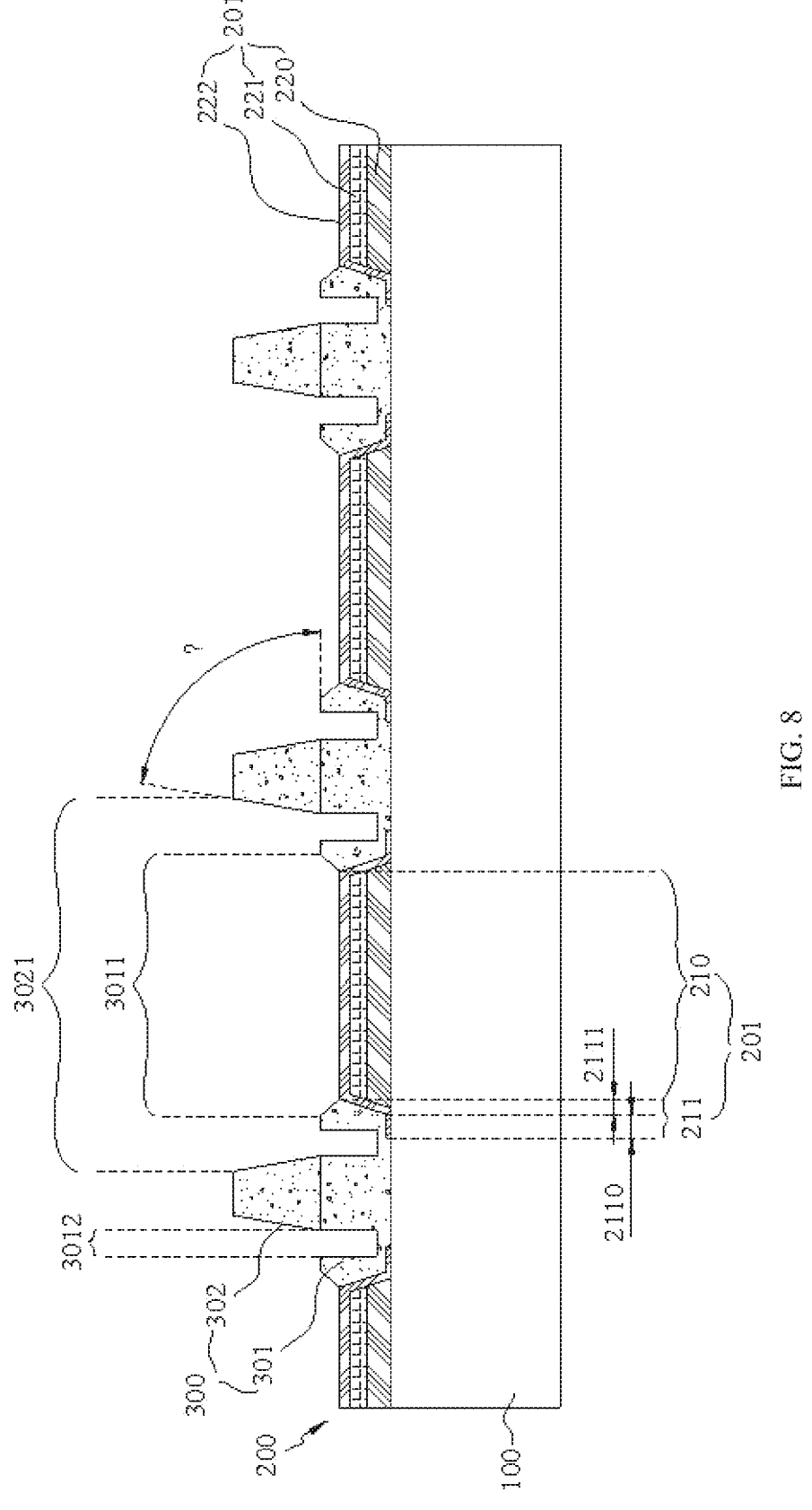
FIG. 8 is a schematic diagram of the second embodiment of the second display panel of the present disclosure.

In other embodiments of the present disclosure, as shown in FIG. 8, the sidewall of the second opening 3021 expands toward a direction facing away from the drive backplane 100, such that the cross-section of the part of the second defining layer 302 located between the two middle parts 210 is trapezoidal. At the same time, the included angle between the sidewall of the second opening 3021 and the middle part 210, that is, the included angle y between an extension surface of the sidewall of the second opening 3021 and an extension surface of the middle part 210 facing away from the drive backplane 100 is not less than 60°, and not more than 90°, for example, it may be 60°, 65°, 70°, 80°, or 90°.

For a tandem OLED display panel, in order to avoid crosstalk between two adjacent light-emitting devices, the charge generation layer 402 of the light-emitting device can be cut off by the leakage cut-off layer 300. The hole injection layer or other film layers can be cut off as well, to prevent crosstalk.

As shown in FIG. 4, in some embodiments of the present disclosure, the light-emitting function layer 400 includes a plurality of light-emitting unit layers 401, and the distribution manners of the hole injection layer, the hole transport layer, the light-emitting layer, the electron transport layer, and the electron injection layer of the respective light-emitting unit layers 401 are the same. At the same time, a charge generation layer 402 is provided between two adjacent light-emitting unit layers 401, such that the light-emitting unit layers 401 are connected in series through the charge generation layer 402, so as to form a series-type OLED light-emitting device.

In the direction perpendicular to the drive backplane 100, the distance between the surface of the second defining layer 302 facing away from the drive backplane 100 and the surface of the middle part 210 of the first electrode 201 facing away from the drive backplane 100, that is, the height of the second defining layer 302 relative to the middle part 210, is not less than 25% of the thickness of the light-emitting function layer 400, and not more than 80% of the thickness of the light-emitting function layer 400. The step formed by the second defining layer 302 can make the charge generation layer 402, the hole injection layer, or other highly conductive film layers of the light-emitting function layer 400 disconnected, thus avoiding crosstalk between adjacent light-emitting devices. For example, if the thickness of the light-emitting function layer 400 is 400 nm, the height of the second defining layer 302 relative to the middle part 210 is not more than 320 nm and not less than 100 nm. If the thickness of the light-emitting function layer 400 is 300 nm, the height of the second defining layer 302 relative to the middle part 210 is not more than 75 nm and not less than 25 nm .

Further, as shown in FIGS. 4, 6 and 7, grooves 3022 can be provided in areas of the second defining layer 302 located outside the second openings 3021. The charge generation layer 402 can be obstructed by the groove 3022, which is beneficial to further cut off the charge generation layer 402, so as to better prevent crosstalk. The shape and structure of the groove 3022 are not particularly limited here, and its depth is less than the depth of the recessed area 501. The number of the grooves 3022 may be one, or more distributed in a concentric ring shape.

Further, as shown in FIG. 4, the width of the groove 3022 is smaller than the distance between the middle parts 210 of two adjacent first electrodes 201. For example, if the distance between two adjacent middle parts 210 is 0.1 μm-1 μm, the maximum width of the groove 3022 is 1 μm. At the same time, in order to ensure the cut-off effect of the groove 3022, the width can be made greater than 0.2 μm, such that the groove 3022 has a certain span, thus the charge generation layer 402 can be cut off due to the existence of the groove 3022.

In addition, the first display panel of the present disclosure may further include a first encapsulation layer 600, a color filter layer 700, a second encapsulation layer 800 and a transparent cover plate 900, wherein the first encapsulation layer 600 may cover the second electrode 500, For example, the first encapsulation layer 600 may include two inorganic layers and an organic layer between the two inorganic layers.

The color filter layer 700 is disposed on a side of the first encapsulation layer 600 facing away from the second electrode 500, and the color filter layer 700 includes filter areas in one-to-one correspondence with the respective first electrodes 201. The color filter areas have a plurality of colors, for example red, blue, and green.

The second encapsulation layer 800 may cover the color filter layer 700, and its structure may be the same as that of the first encapsulation layer 600.

The transparent cover plate 900 can cover the second encapsulation layer 800, and its material can be glass or other materials.

The third display panel

As shown in FIGS. 9 and 10, the third display panel may include a drive backplane 100, a first electrode layer 200, a leakage cut-off layer 300, a light-emitting function layer 400, and a second electrode 500.

The first electrode layer 200 is disposed on a surface of the drive backplane 100 and includes a plurality of first electrodes 201 distributed in an array. The first electrode 201 includes a flat middle part 210 and an inclined edge part 211 surrounding the middle part 210. The edge part 211 includes a horizontal part 2110 surrounding the middle part 210, and a climbing part 2111 connected between the middle part 210 and the horizontal part 2110. The thickness of the horizontal part 2110 is smaller than that of the middle part 210.

The leakage cut-off layer 300 includes a first defining layer 301 and a second defining layer 302. The first defining layer 301 and the first electrode layer 200 are provided on the same surface of the drive backplane 100 and have a plurality of openings 3011. The respective first electrodes 201 are provided in the openings 3011 in one-to-one correspondence, that is, each opening 3011 of the first defining layer 301 is provided with a first electrode 201. Between the edge part 211 of each first electrode 201 and the sidewall of the opening 3011 where the first electrode 201 is located, a space area X exposing the drive backplane 100 is formed. The second defining layer 302 covers the first defining layer 301 and the drive backplane 100 located in the space area X, and exposes the middle part 210 of the first electrode 201, and the second defining layer 302 is recessed toward the drive backplane 100 in the space area X and an area corresponding to the edge part 211, that is, the second defining layer 302 conforms to the surfaces of the first defining layer 301 and the drive backplane 100.

The light-emitting function layer 400 covers at least the second defining layer 302 and the middle part 210 of the first electrode 201, and the second electrode 500 covers the light-emitting function layer 400.

In the third display panel of the present disclosure, since the second defining layer 302 is recessed in the space area X toward the drive backplane 100, the pits formed by the light-emitting function layer 400 due to process reasons can be located at positions corresponding to the space areas X or edge parts 211, and do not face the middle parts 210. Correspondingly, the recessed areas 501 of the second electrode 500 formed after the second electrode 500 is recessed at the pits do not facing the middle parts 210, that is, the orthographic projection of the lowest point of the recessed area 501 of the second electrode 500 on the cross-section perpendicular to the drive backplane 100, on the drive backplane 100, is located outside the orthographic projection of the middle part 210, that is, outside the orthographic projection of the light-emitting device, such that tip discharge or even a short-circuit occurring between the second electrode 500 in the recessed area 501 and the middle part 210, which helps to ensure that the light-emitting device emits light stably. Simultaneously, light emission within the range of the recessed area 501 can be avoided, thereby reducing the mutual interference of the light emission of adjacent light-emitting devices.

The following is a detailed description of the third display panel.

As shown in FIGS. 9 and 10, the specific structures of the drive backplane 100 and the first electrode layer 200 of the third display panel can refer to the above-mentioned second display panel, which will not be described in detail here.

In some embodiments of the present disclosure, the drive backplane 100 includes a substrate 101, drive transistors and a planarization layer 109. The substrate 101 may be a silicon substrate, and the drive transistors are provided on a side of the substrate 101. The planarization layer 109 is provided on a side of the drive transistor facing away from the substrate 101. The first electrode layer 200 and the leakage cut-off layer 300 are provided on a surface of the planarization layer 109 facing away from the substrate 101.

Specifically, the drive backplane 100 may be a silicon-based backplane, and may include a substrate 101, a gate insulating layer 103, a gate 104, a first insulating layer 105, a first wiring layer 106, a second insulating layer 107, a second wiring layer 108 and a planarization layer 109. The substrate 101 includes an active area 102, and the active area 102 has a source electrode 1021 and a drain electrode 1022, the specific structure of which can refer to the implementation of the second display panel. The first defining layer 301 and the first electrode 201 may be provided on the surface of the planarization layer 109 facing away from the substrate 101. The materials of the planarization layer 109, the first defining layer 301 and the second defining layer 302 may include insulating materials such as silicon oxide and silicon nitride.

In some embodiments of the present disclosure, the thickness of the first defining layer 301 may be greater than that of the first electrode layer 200, so as to cut off layers such the hole injection layer in the light-emitting function layer 400 that can generate crosstalk between two adjacent sub-pixels.

In some embodiments of the present disclosure, the first electrode 201 includes a first conductive layer 220, a second conductive layer 221 and a third conductive layer 222. The first conductive layer 220 is provided on the surface of the planarization layer 109 facing away from the substrate 101. The second conductive layer 221 is disposed on a surface of the first conductive layer 220 facing away from the drive backplane 100. The third conductive layer 222 is disposed on a surface of the second conductive layer 221 facing away from the drive backplane 100, and extends to the drive backplane 100 at a certain slope, so as to cover the first conductive layer 220 and the second conductive layer 221, to protect the first conductive layer 220 and the second conductive layer 221. The middle part 210 of the first electrode 201 includes an area of the third conductive layer 222 located in the area of the second conductive layer 221 facing away from the surface of the drive backplane 100, and the first conductive layer 220 and the second conductive layer 221. The edge part 211 includes an area of the third conductive layer 222 covering the edge of the first conductive layer 220 and the second conductive layer 221, that is, an area extending toward the drive backplane 100. Exemplarily, the material of the first conductive layer 220 may include titanium (Ti), the material of the second conductive layer 221 may include silver (Ag), and the material of the third conductive layer 222 may include indium tin oxide (ITO). Each of the conductive layers may adopt other materials as well.

In some embodiments of the present disclosure, the thickness of the second defining layer 302 is smaller than that of the first defining layer 301. Further, the thickness of the second defining layer 302 can be less than 1/5 of the thickness of the first defining layer 301, which can avoid failure of forming a recessed structure due to filling up the space area X and the edge part 211. For example, the thickness of the first defining layer 301 is about 350 nm, and the thickness of the second defining layer 302 is not greater than 70 nm, for example, the thickness of the second defining layer 302 is 60 nm, 50 nm, etc.

In some embodiments of the present disclosure, the drive backplane 100 is provided with an annular groove 110 surrounding the first electrode 201 in each space area X, and the part of the second defining layer 302 located in the space area X is recessed into the annular groove 110. For example, the annular groove 110 is formed on the planarization layer 109, and the depth of the annular groove 110 is smaller than the thickness of the planarization layer 109, and the specific thickness is not specifically limited herein.

Specifically, the materials of the planarization layer 109, the first defining layer 301 and the second defining layer 302 may include silicon oxide and silicon nitride, and the materials of the three ones are the same, for example: all of the planarization layer 109, the first defining layer 301 and the second defining layer 302 are silicon oxide. When the first defining layer 301 is formed by an etching process, the position of the space area X is over-etched, and the over-etched area extends along the sidewall of the opening 3011 into the drive backplane 100, such that at least a part area of the drive backplane 100 located in the space area X is etched as well, to form an annular groove 110, that is, the planarization layer 109 is etched. In some embodiments of the present disclosure, an orthographic projection of the annular groove 110 on the drive backplane 100 overlaps an orthographic projection of the space area X, that is, the sidewall of the annular groove 110 is the edge of the space area X. The over-etched area can be smaller than the space area X, such that the sidewall of the annular groove 110 and the edge 211 of the first electrode 201 can have a certain distance therebetween. In some embodiments of the present disclosure, the slope a of an area of the second electrode 500 between the middle part 210 and the annular groove 110 relative to the middle part 210 is less than 60°, and may be for example, 50°, 45°, 40°, 30°, and so on. A slope 13 of an area of the second electrode 500 covering the sidewall of the opening 3011 relative to the middle part 210 of the first electrode 201 is not less than 65°, and not more than 90°, and may be for example, 60°, 75°, 90°, and so on.

As shown in FIGS. 9 and 10, the light-emitting function layer 400 covers at least a part area of the second defining layer 302 and the first electrode 201. When the light-emitting function layer 400 is formed by an evaporation process, the parts of the light-emitting function layers 400 located in the space areas X are recessed toward the drive backplane 100 to form pits. Simultaneously, an area of the light-emitting function layer 400 corresponding to the first defining layer 301 forms a convex structure. The specific details of the light-emitting function layer 400 can refer to the implementation of the second display panel, which will not be described in detail here.

As shown in FIGS. 9 and 10, the second electrode 500 covers the light-emitting function layer 400, and is recessed in the pits of the light-emitting function layer 400 to form recessed areas 501. Due to the limitation of the pits, Orthographic projections of the lowest points of the recessed areas 501 on the cross-sections perpendicular to the driving the backplane 100, on the drive backplane 100, are located within the orthographic projections of the range of the space areas X or the edge parts 211, that is, located outside the orthographic projections of the middle parts 210, that is, located outside the orthographic projections of the light-emitting device, thereby preventing that tip discharge or even short circuit occurs between the recessed areas 501 of the second electrodes 500 and the first electrodes 201, which is beneficial to ensure that the light-emitting device emits light stably. Simultaneously, light emission within the range of the recessed area 501 can be avoided, thereby reducing the mutual interference of the light emission of adjacent light-emitting devices. In addition, the area of the second electrode 500 corresponding to the first defining layer 301 is the protruding area 502, and areas of the second electrode 500 corresponding to the middle parts 210 are flat areas 503. The connection relationship of the recessed areas 501, the protruding area 502 and the flat areas 503 can refer to the protruding area 411, the first recessed areas 412 and the flat parts 42 in the embodiments of the first display panel, which will not be described in detail here.

In addition, as shown in FIGS. 9 and 10, the display panel of the present disclosure may further include a first encapsulation layer 600, a color film layer 700, a second encapsulation layer 800 and a transparent cover plate 900, the specific structures of which may refer to the implementation of the first type and the second type of display panel above, which will not be described in detail here.

The embodiments of the present disclosure further provide a method of manufacturing a display panel, and the display panel may be the second type of display panel described above. As shown in FIG. 11, the manufacturing method includes steps S110 to S140.

Step S110, forming a first electrode layer on a surface of the drive backplane, wherein the first electrode layer includes a plurality of first electrodes distributed in an array, the first electrode includes a flat middle part and an edge part surrounding the middle part, the edge part includes a horizontal part surrounding the middle part and a climbing part connected between the middle part and the horizontal part, and a thickness of the horizontal part is smaller than that of the middle part.

Step S120, forming a leakage cut-off layer on a surface of the drive backplane where the first electrode layer is provided, wherein the leakage cut-off layer includes a first defining layer and a second defining layer that are sequentially stacked in a direction facing away from the drive backplane, the first defining layer is provided with first openings exposing the respective first electrodes in one-to-one correspondence, the second defining layer is provided with second openings surrounding outside the first openings at positions corresponding to the first openings, an orthographic projection of the second defining layer on the drive backplane and the orthographic projections of the middle parts are spaced by intervals, the first defining layer is provided a plurality of annular holes with blind hole structure surrounding the first openings in one-to-one correspondence, and the second defining layer is provided on a surface of the first defining layer facing away from the drive backplane and is located outside the annular holes.

Step S130, forming a light-emitting function layer at least partially covering the leakage cut-off layer and the middle part.

Step S140, forming a second electrode covering the light-emitting function layer.

In some embodiments of the present disclosure, forming a leakage cut-off layer on a surface of the drive backplane where the first electrode layer is provided, that is, step S120, further includes:

Step S1210, forming the first defining layer on the surface of the drive backplane where the first electrode layer is provided, wherein the first defining layer is provided with first openings exposing the respective first electrodes in one-to-one correspondence, and a plurality of annular holes in blind hole structure surrounding the first openings in one-to-one correspondence.

Step S1220, forming a second defining layer on a surface of the first defining layer facing away from the drive backplane, wherein the second defining layer is provided second openings surrounding the first openings at positions corresponding to the first openings, an orthographic projection of the second defining layer on the drive backplane and the middle parts are spaced by intervals, and the second defining layer is provided on the surface of the first defining layer facing away from the drive backplane and is located outside the annular holes.

The details and beneficial effects of the structures of the respective layers in the manufacturing method of the embodiments of the present disclosure have been described in the above embodiment of the second display panel, and will not be repeated here.

In some embodiments of the present disclosure, the first defining layer and the second defining layer can be formed at one time by a gray-scale mask process or other patterning processes. They can be formed separately as well, and there is no special limitation here.

The embodiments of the present disclosure further provide a method of manufacturing a display panel, and the display panel may be, for example, the third display panel described above. As shown in FIG. 12, the manufacturing method includes step S210-step S250.

Step S210, forming a first electrode layer on a surface of the drive backplane, wherein the first electrode layer includes a plurality of first electrodes distributed in an array, the first electrode includes a flat middle part and an edge part surrounding the middle part, the edge part includes a horizontal part surrounding the middle part and a climbing part connected between the middle part and the horizontal part, and a thickness of the horizontal part is smaller than that of the middle part.

Step S220, forming a first defining layer on a surface of the drive backplane where the first electrode layer is provided, wherein the first defining layer is provided with a plurality of openings, the respective the first electrodes are provided in the first electrodes in one-to-one correspondence, and a space area exposing the drive backplane is formed between each of the edge parts and a sidewall of the opening where the edge part is located.

Step S230, forming a second defining layer covering the first defining layer and the drive backplane located in the space areas, wherein the second defining layer at least partially exposes the respective middle parts, and is recessed toward the drive backplane in the space areas and areas corresponding to the edge parts.

Step S240, forming a light-emitting function layer that at least partially covers the second defining layer and the middle parts.

Step S250, forming a second electrode covering the light-emitting function layer.

The details and beneficial effects of the structures of the respective layers in the manufacturing method of the embodiment of the present disclosure have been described in the embodiments of the third display panel above, and will not be repeated here.

It should be noted that although various steps of the method in the present disclosure are described in a specific order in the drawings, this does not require or imply that these steps must be performed in the specific order, or in order to realize the desired result, all the steps shown must be performed. Additionally or alternatively, some steps may be omitted, a plurality of steps may be combined into one step for execution, and/or one step may be decomposed into a plurality of steps for execution, etc.

The embodiments of the present disclosure further provide a display device, and the display device may include any one of the respective embodiments of the above-mentioned first type display panel, second type display panel and third type display panel. The specific structures of first type display panel to the third display panel can refer to the above implementation manners, which will not be repeated here. The display device of the present disclosure can be used in electronic devices such as mobile phones, tablet computers, and televisions.

Those skilled in the art will easily think of other embodiments of the present disclosure after considering the specification and practicing the invention disclosed herein. This application is intended to cover any variations, uses, or adaptive changes of the present disclosure. These variations, uses, or adaptive changes follow the general principles of the present disclosure and include common knowledge or conventional technical means in the technical field that are not disclosed in the present disclosure. The description and embodiments are only regarded as exemplary, and the true scope and spirit of the present disclosure are pointed out by the appended claims.

What is claimed is:

1. A display panel, comprising:
a drive backplane;
a first electrode layer arranged on a surface of the drive backplane, and comprising a plurality of first electrodes distributed in an array;
a light-emitting function layer provided on a side of the first electrode layer facing away from the drive backplane; and
a second electrode covering the light-emitting function layer, and comprising a separating part and a plurality of flat parts separated by the separating part, wherein the separating part comprises protruding areas and first recessed areas, the protruding areas protrude away from the drive backplane, and the first recessed areas are recessed toward the drive backplane, wherein in the separating part, only one protruding area is provided between any two adjacent first recessed areas.

2. The display panel according to claim 1, wherein:
the first electrode comprises a middle part and an edge part surrounding the middle part, and the edge part comprises a horizontal part surrounding the middle part and a climbing part connected between the middle part and the horizontal part;
the light-emitting function layer at least partially covers the middle parts directly; and
orthographic projections of the respective flat parts on the drive backplane are located within orthographic projections of the respective first electrodes on the drive backplane in one-to-one correspondence, and orthographic projections of the first recessed areas on the drive backplane are at least partially located outside orthographic projections of the middle parts of the first electrodes on the drive backplane.

3. The display panel according to claim 2, wherein orthographic projections of lowest points of the first recessed areas on the drive backplane are located outside the orthographic projections of the middle parts of the first electrodes on the drive backplane.

4. The display panel according to claim 1, wherein the first recessed area comprises a first side surface connected to the flat part and a second side surface connected to the protruding area, and the first side surface and the second side surface shrink along a direction close to the drive backplane.

5. The display panel according to claim 2, wherein the display panel further comprises:
a leakage cut-off layer provided on a same side of the drive backplane with the first electrode layer, and divided by the first electrodes, wherein the light-emitting function layer covers the leakage cut-off layer, areas of the leakage cut-off layer located among the first electrodes have protruding structures, orthographic projections of the protruding structures on the drive backplane are spaced apart from the orthographic projections of the first electrodes on the drive backplane, and a respective orthographic projection of at least one of the protruding structures on the drive backplane is located within an orthographic projection of at least one of the protruding areas on the drive backplane.

6. The display panel according to claim 5, wherein at least a part of area of the orthographic projection of at least one of the first recessed areas on the drive backplane is located between the orthographic projection of the protruding structure on the drive backplane and the orthographic projection of the first electrode on the drive backplane.

7. The display panel according to claim 5, wherein:

the leakage cut-off layer comprises a first defining layer and a second defining layer sequentially stacked in a direction facing away from the drive backplane, and both the first defining layer and the second defining layer at least partially expose the middle parts of the first electrodes, and an edge of an orthographic projection of the second defining layer on the drive backplane is located outside the orthographic projections of the middle parts of the first electrodes on the drive backplane; and the protruding structures comprise the second defining layer and a part of the first defining layer corresponding to the second defining layer.

8. The display panel according to claim 5, wherein:

the leakage cut-off layer comprises a first defining layer and a second defining layer;

the first defining layer is provided on a same surface of the drive backplane with the first electrode layer and has a plurality of openings, the respective first electrodes are arranged in the respective openings in one-to-one correspondence, and a space area exposing the drive backplane is formed between the edge part of each of the first electrodes and a sidewall of the opening where the first electrode is located;

the second defining layer covers the first defining layer and the drive backplane located in the space area, and at least partially exposes the middle part of the first electrode, the second defining layer is recessed toward the drive backplane in the space area and an area corresponding to the edge part, a thickness of the second defining layer is smaller than that of the first defining layer, and the first defining layer and areas where the second defining layer covers the first defining layer are the protruding structures; and the light-emitting function layer covers the second defining layer.

9. The display panel according to claim 7, wherein material of the first defining layer is inorganic non-metallic material, metallic material or organic material.

10. The display panel according to claim 2, wherein the display panel further comprises:

a leakage cut-off layer provided on a same side of the drive backplane with the first electrode layer, and configured to space the first electrodes, wherein the light-emitting function layer covers the leakage cut-off layer, wherein an area of the leakage cut-off layer located between the middle parts of any two adjacent first electrodes has two overlapping parts, two recessed structures and a protruding structure, the two overlapping parts are respectively located on surfaces of the two middle parts facing away from the drive backplane, the two recessed structures are located between the two overlapping parts, and the protruding structure is located between the two recessed structures.

11. A display device, comprising the display panel according to claim 1.

* * * * *